(12) United States Patent
Kim et al.

(10) Patent No.: US 11,950,479 B2
(45) Date of Patent: Apr. 2, 2024

(54) DISPLAY DEVICE AND METHOD FOR FABRICATING THE SAME

(71) Applicant: Samsung Display Co., LTD., Yongin-si (KR)

(72) Inventors: Kyong Sub Kim, Hwaseong-si (KR); Sung Ho Park, Cheonan-si (KR); Jae Won Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 360 days.

(21) Appl. No.: 17/499,195

(22) Filed: Oct. 12, 2021

(65) Prior Publication Data

US 2022/0165809 A1 May 26, 2022

(30) Foreign Application Priority Data

Nov. 23, 2020 (KR) .......................... 10-2020-0157605

(51) Int. Cl.
| | | |
|---|---|---|
| *H01L 21/00* | (2006.01) | |
| *H10K 59/131* | (2023.01) | |
| *H10K 59/35* | (2023.01) | |
| *H10K 71/00* | (2023.01) | |
| *H10K 59/12* | (2023.01) | |

(52) U.S. Cl.
CPC ......... *H10K 59/353* (2023.02); *H10K 59/131* (2023.02); *H10K 71/00* (2023.02); *H10K 59/1201* (2023.02)

(58) Field of Classification Search
CPC ..... H10K 59/131; H10K 59/353; H10K 71/00
See application file for complete search history.

(56) References Cited

U.S. PATENT DOCUMENTS

2020/0005703 A1* 1/2020 Kim .......................... G09G 3/32
2021/0358393 A1* 11/2021 Kang ..................... H01L 33/62

FOREIGN PATENT DOCUMENTS

| KR | 10-1730927 | 4/2017 |
|---|---|---|
| KR | 10-2020-0001648 | 1/2020 |
| KR | 10-2020-0004482 | 1/2020 |
| KR | 10-2020-0034906 | 4/2020 |

* cited by examiner

*Primary Examiner* — Douglas M Menz
(74) *Attorney, Agent, or Firm* — KILE PARK REED & HOUTTEMAN PLLC

(57) ABSTRACT

A display device comprises a display area and a non-display area, sub-pixels in the display area, each sub-pixel including a first electrode and a second electrode extended in a first direction and light-emitting elements disposed on the first electrode and the second electrode, sub-lines disposed in the non-display area and extended in a second direction, and conductive patterns extended in the first direction, each conductive pattern being connected to at least one of the plurality of sub-lines. The sub-lines comprise first, second, and third sub-lines sequentially disposed from the first sub-line toward the display area. The conductive patterns are disposed in at least one of the sub-pixels closest to the sub-lines. The conductive patterns comprise a first conductive pattern connected to the first sub-line, second conductive patterns connected to the second sub-line, and a third conductive pattern connected to the third sub-line.

20 Claims, 24 Drawing Sheets

DISPLAY DEVICE AND METHOD FOR FABRICATING THE SAME

CROSS-REFERENCE TO RELATED APPLICATION(S)

This application claims priority to and benefits of Korean Patent Application No. 10-2020-0157605 under 35 U.S.C. 119, filed on Nov. 23, 2020 in the Korean Intellectual Property Office, the entire contents of which are herein incorporated by reference.

BACKGROUND

1. Technical Field

The disclosure relates to a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently in use.

Display devices may display images and may include a display panel such as an organic light-emitting display panel or a liquid-crystal display panel. Among display panels, a light-emitting display panel may include light-emitting elements. For example, light-emitting diodes (LEDs) may include an organic light-emitting diode using an organic material as a luminescent material, or an inorganic light-emitting diode using an inorganic material as a luminescent material.

SUMMARY

Aspects of the disclosure provide a display device that may include improved alignment degree of light-emitting elements by way of applying different voltages through a plurality of sub-lines, and a method of fabricating the same.

It should be noted that aspects of the disclosure are not limited to the above; and other aspects of the disclosure will be apparent to those skilled in the art from the following descriptions.

According to an embodiment of the disclosure, sub-pixels in a display device may be sorted into different types, and different alignment signals may be applied through different sub-lines, so that it may be possible to reduce influence due to contact resistance between pads without increasing the magnitude of the voltage. In this manner, a voltage of sufficient magnitude can be applied to each sub-pixel in the display device, and thus the alignment degree of the light-emitting elements can be improved.

It should be noted that effects of the disclosure are not limited to those described above and other effects of the disclosure will be apparent to those skilled in the art from the following descriptions.

According to an embodiment of the disclosure, a display device may include a display area and a non-display area adjacent to the display area, sub-pixels disposed in the display area in a second direction, each of the sub-pixels including a first electrode and a second electrode extended in a first direction intersecting the second direction, and light-emitting elements disposed on the first electrode and the second electrode, sub-lines disposed in the non-display area and extended in the second direction, and conductive patterns extended in the first direction, each of the conductive patterns being connected to at least one of the sub-lines, wherein the sub-lines may include a first sub-line, a second sub-line and a third sub-line sequentially disposed from the first sub-line toward the display area, the conductive patterns may be disposed in at least one of the sub-pixels that may be closest to the sub-lines, and the conductive patterns may include a first conductive pattern connected to the first sub-line, second conductive patterns connected to the second sub-line, and a third conductive pattern connected to the third sub-line.

The first electrode and the second electrode of each of the sub-pixels may be disposed in line in the first direction with different conductive patterns.

Each of the sub-pixels may include an emission area in which the light-emitting elements are disposed, and a subsidiary area spaced apart from the emission area in the first direction, and the first electrode and the second electrode may be spaced apart from the conductive patterns in the first direction in the subsidiary area of at least some of the sub-pixels.

The sub-pixels may include a first sub-pixel having the first electrode in line with the first conductive pattern in the first direction, and a second sub-pixel having the second electrode in line with the third conductive pattern in the first direction.

The second conductive patterns may comprise a first-type conductive pattern in line with the second electrode of the first sub-pixel in the first direction, and a second-type conductive pattern in line with the first electrode of the second sub-pixel in the first direction.

The first conductive pattern and the third conductive pattern may be spaced apart from each other in the second direction, and the first-type conductive pattern and the second-type conductive pattern adjacent to each other may be disposed between the first conductive pattern and the third conductive pattern.

A direction in which a first end of each of the light-emitting elements disposed in the first sub-pixel faces may be same as a direction in which a first end of each of the light-emitting elements disposed in the second sub-pixel faces.

An area of the first sub-pixel and an area of the second sub-pixel may be same, and the sub-pixels may further comprise a third sub-pixel having an area smaller than the area of the first sub-pixel and including a first electrode in line with the first conductive pattern in the first direction.

Light emitted from the light-emitting elements disposed in the first sub-pixel and light emitted from the light-emitting elements disposed in the third sub-pixel may have different colors.

The sub-pixels may comprise a first sub-pixel having the first electrode in line with the first conductive pattern in the first direction, and a second sub-pixel having the second electrode in line with the third conductive pattern in the first direction.

The second conductive patterns may include a first-type conductive pattern in line with the second electrode of the first sub-pixel in the first direction, and a second-type conductive pattern in line with the second electrode of the second sub-pixel in the first direction.

The first conductive pattern and the third conductive pattern may be spaced apart from each other in the second direction, the first-type conductive pattern may be disposed between the first conductive pattern and the third conductive pattern, and the second-type conductive pattern may be spaced apart from the first-type conductive pattern in the second direction with the third conductive pattern therebetween.

A direction in which a first end of each of the light-emitting elements disposed in the first sub-pixel faces may be different from a direction in which a first end of each of the light-emitting elements disposed in the second sub-pixel faces.

An area of the first sub-pixel and an area of the second sub-pixel may be same, and the sub-pixels may further include a third sub-pixel having an area smaller than the area of the first sub-pixel and including a first electrode in line with the first conductive pattern in the first direction.

A length of the first conductive pattern in the first direction may be larger than a length of the second conductive pattern in the first direction, and a length of the second conductive pattern in the first direction may be larger than a length of the third conductive pattern in the first direction.

The conductive patterns and the first electrode and the second electrode may be disposed on a same layer, and the sub-lines and the conductive patterns may be disposed on different layers.

According to an embodiment of the disclosure, a method of fabricating a display device may include preparing sub-lines extended in a first direction, and electrode lines each connected to one of the sub-lines and extended in a second direction intersecting the first direction, ejecting light-emitting elements onto the electrode lines, applying a first alignment voltage to a first electrode line among the electrode lines, grounding second electrode lines spaced apart from the first electrode line in the first direction, and applying a second alignment voltage having a polarity opposite to a polarity of the first alignment voltage to a third electrode line spaced apart from one of the second electrode lines in the first direction, to align the light-emitting elements on the first electrode and one of the second electrode lines or on another one of the second electrode lines and the third electrode line, and separating the electrode lines into parts to form electrodes on which the light-emitting elements may be arranged and conductive patterns each connected to a sub-line.

The preparing of the sub-lines may include preparing a first sub-line to which the first electrode line may be connected, preparing a second sub-line to which the second electrode lines may be connected, and preparing a third sub-line to which the third electrode line may be connected, and the forming of the conductive patterns may include forming a first conductive pattern by separating the first electrode line to be connected to the first sub-line, forming second conductive patterns by separating the second electrode lines to be connected to the second sub-line, and forming a third conductive pattern by separating the third electrode line to be connected to the third sub-line.

The second electrode lines may be disposed between the first electrode line and the third electrode line, and the forming of the second conductive patterns may include forming a first-type conductive pattern from which one of the second electrode lines that may be adjacent to the first electrode line may be separated, and forming a second-type conductive pattern from which the other one of the second electrode lines that may be adjacent to the third electrode line may be separated.

The forming of the electrodes may include forming a first electrode and a second electrode that are each in line with a respective one of the conductive patterns in a second direction, and a part of the light-emitting elements may be disposed on the first electrode in line with the first conductive pattern and the second electrode in line with the first-type conductive pattern, and another part of the light-emitting elements may be disposed on the first electrode in line with the second-type conductive pattern and the second electrode in line with the third conductive pattern.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
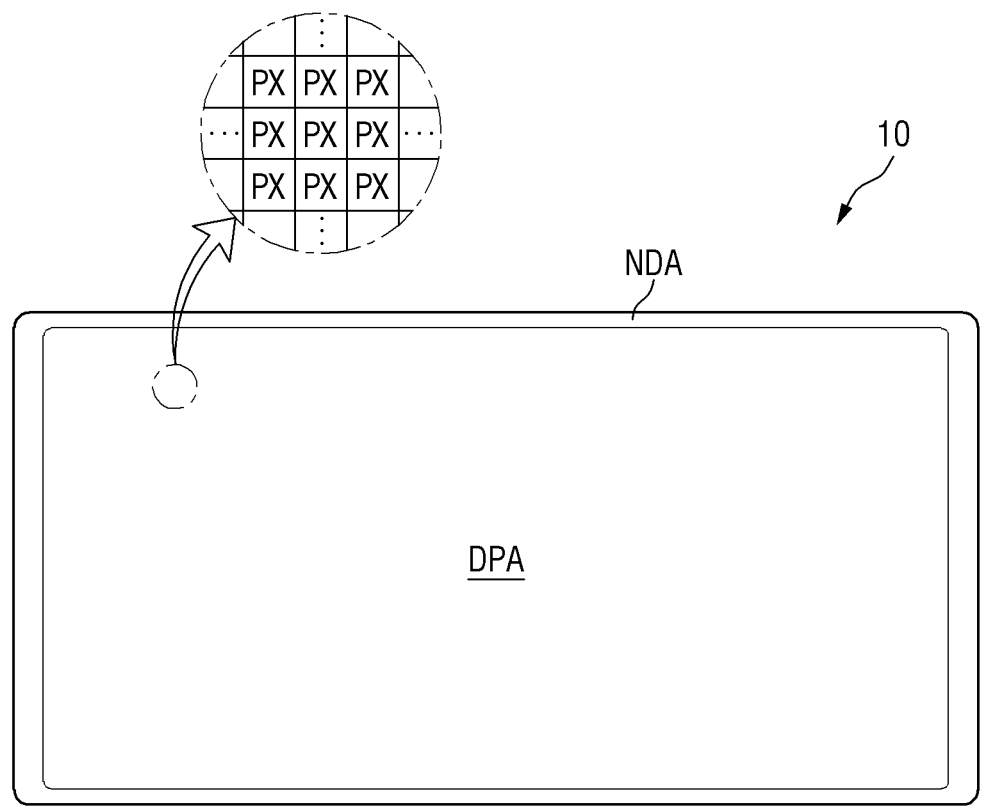
FIG. 1 is a schematic plan view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise. The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or "to not overlap" another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment of the disclosure.

Referring to FIG. 1, the display device 10 may display a moving image or a still image. The display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Other types of display panels may be employed.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. In the example shown in FIG. 1, the display device 10 has a rectangular shape with the longer sides in a second direction DR2.

The display device 10 may include the display area DPA and a non-display area NDA. In the display area DPA, images can be displayed. In the non-display area NDA, images may not be displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged in a matrix. The shape of each pixel PX may be, but is not limited to, a rectangle or a square when viewed from the top. Each pixel may have a diamond shape having sides inclined with respect to a direction. The pixels PX may be arranged in stripes or a PenTile® pattern. Each of the pixels PX may include at least one light-emitting element that emits light of a particular wavelength band to represent a color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in the non-display area NDA, and/or external devices may be mounted.

Figure 2:
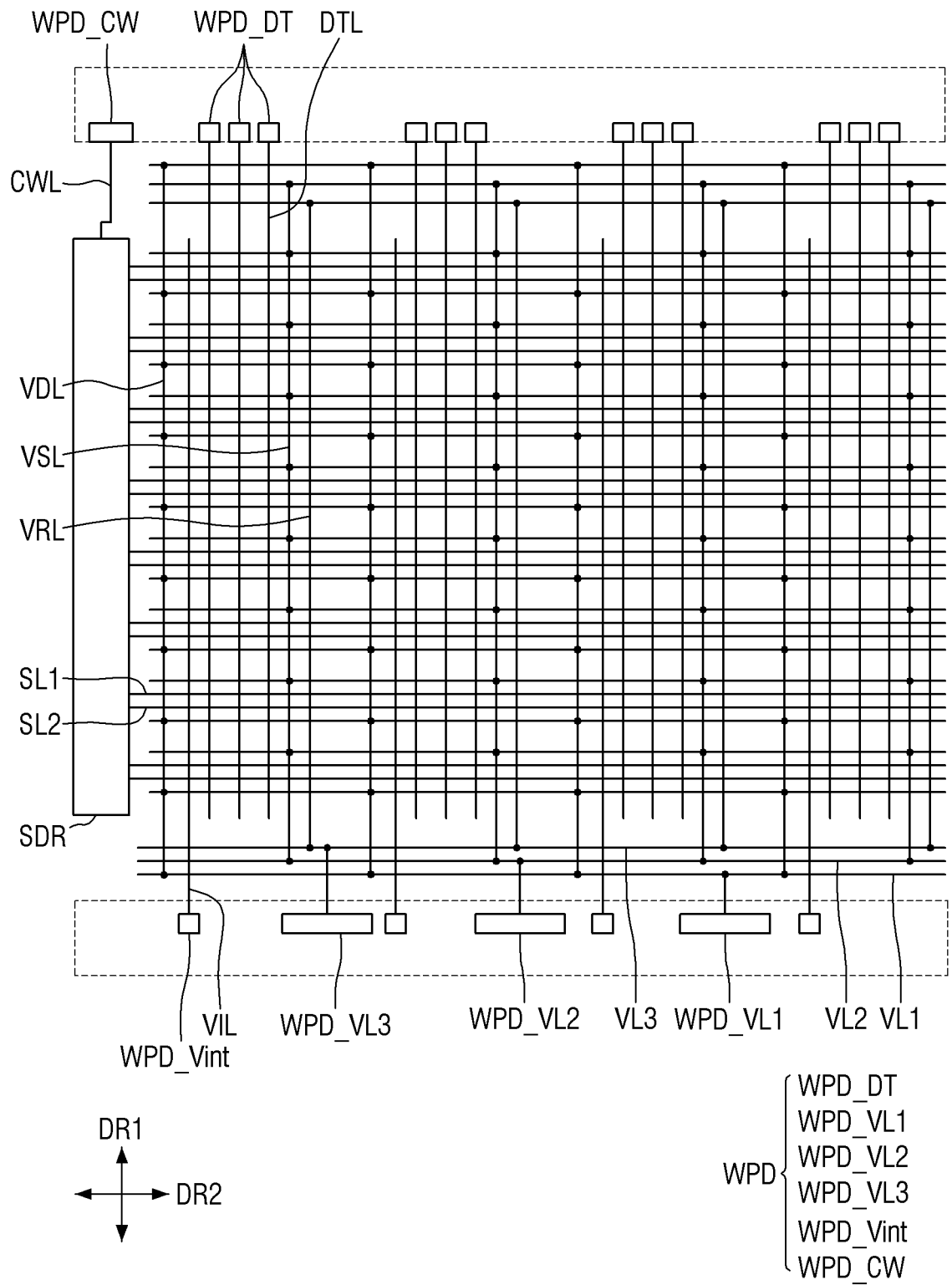
FIG. 2 is a schematic view showing lines disposed in a display device according to an embodiment of the disclosure.

FIG. 2 is a schematic view showing lines disposed in a display device according to an embodiment of the disclosure.

Referring to FIG. 2, the display device 10 may include multiple lines. The lines may include a first scan line SL1, a second scan line SL2, a data line DTL, an initialization voltage line VIL, sub-lines VL1, VL2 and VL3, first to third voltage lines VDL, VSL and VRL, etc. Also, although not shown in the drawings, other lines may be further disposed in the display device 10.

The first scan line SL1 and the second scan line SL2 may be extended in the second direction DR2. The first scan line SL1 and the second scan line SL2 may be connected to a scan driver SDR. The scan driver SDR may include a driving circuit. The scan driver SDR may be disposed on, but is not limited to, one side of the display area DPA in the second direction DR2. The scan driver SDR may be connected to a signal line CWL. At least one end of the signal line CWL may be connected to an external device through a pad WPD_CW in a pad area of the non-display area NDA.

As used herein, when an element is referred to as being "connected" or "coupled" to another element, it can be directly connected or coupled to the element or intervening elements may be present. Such elements may be understood in an embodiment as a single integrated element and thus one portion thereof may be connected to another portion. Moreover, when an element is referred to as being "connected" to another element, it may, in an embodiment, be in direct contact with the element and also electrically connected to the element.

The sub-lines VL1, VL2 and VL3 may be extended in the second direction DR2. The first to third sub-lines VL1, VL2 and VL3 may be disposed between the display area DPA where the first and second scan lines SL1 and SL2 may be disposed and the pad areas PDA located on both sides of the display area DPA in the first direction DR1. Between the display area DPA and each of the pad areas PDA, the third sub-line VL3, the second sub-line VL2 and the first sub-line VL1 may be disposed in this order from the display area DPA to the pad areas PDA.

The data line DTL and the initialization voltage line VIL may be extended in the first direction DR1 intersecting the second direction DR2. The first to third voltage lines VDL, VSL and VRL may also be extended in the first direction DR1. The first voltage line VDL may be connected to the first sub-line VL1, the second voltage line VSL may be connected to the second sub-line VL2, and the third voltage line VRL may be connected to the third sub-line VL3. The first to third sub-lines VL1, VL2 and VL3 extended in the second direction DR2 on the upper side of the display area DPA may be connected to the first to third sub-lines VL1, VL2 and VL3 on the lower side of the display area DPA through the first to third voltage lines VDL, VSL and VRL.

The first voltage line VDL and the second voltage line VSL may include parts extended in the second direction DR2 and parts extended in the first direction DR1. The first voltage line VDL and the second voltage line VSL may be formed as conductive layers in which the parts extended in the first direction DR1 and the parts extended in the second direction DR2 may be disposed on different layers, and may have a mesh structure on a front surface of the display area DPA. It is, however, to be understood that the disclosure is not limited thereto. Each of the pixels PX of the display device 10 may be connected to at least one data line DTL, the initialization voltage line VIL, the first voltage line VDL, and the second voltage line VSL.

The data line DTL, the initialization voltage line VIL, the first sub-line VL1, the second sub-line VL2 and the third sub-line VL3 may be electrically connected to one or more pads WPD. The pads WPD may be disposed in the non-display area NDA. According to an embodiment of the disclosure, the pads WPD_DT of the data lines DTL (hereinafter referred to as data pads) may be disposed in the pad area PDA located on the upper side of the display area DPA in the first direction DR1. A pad WPD_Vint of the initialization voltage line VIL (hereinafter referred to as an initialization voltage pad) and pads WPD_VL1, WPD_VL2 and WPD_VL3 of the first to third sub-lines VL1, VL2 and VL3 (hereinafter referred to as first to third wire pads) may be disposed in the pad area PDA located on the lower side of the display area DPA in the first direction DR1. In other embodiments, the data pads WPD_DT, the initialization voltage pad WPD_Vint and the first to third wire pads WPD_VL1, WDP_VL2 and WPD_VL3 all may be disposed in the same area, e.g., the pad area PDA located on the lower side of the display area DPA. External devices may be mounted on the pads WPD. The external device may be mounted on the pads WPD by an anisotropic conductive film, ultrasonic bonding, etc.

Each of the pixels PX or sub-pixels SPn of the display device 10 includes a pixel driving circuit, where n may be an integer of 1 to 3. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to an embodiment of the disclosure, each of the sub-pixels SPn of the display device 10 may have a 3T1C structure, e.g., a pixel driving circuit may include three transistors and one capacitor. In the following description, the pixel driving circuit having the 3T1C structure will be described as an example. It is, however, to be understood that the disclosure is not limited thereto. A variety of modified pixel structures may be employed such as a 2T1C structure, a 7T1C structure and a 6T1C structure.

Figure 3:
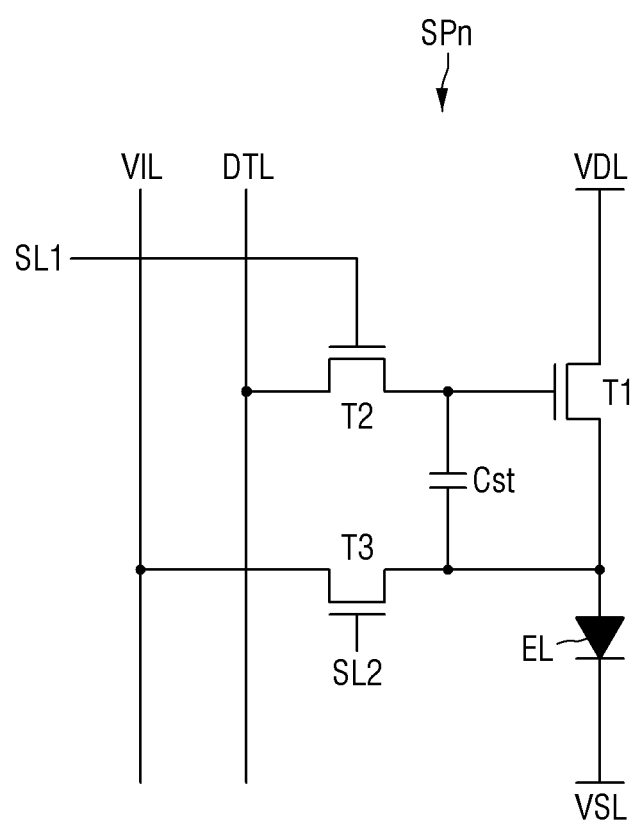
FIG. 3 is a schematic diagram of an equivalent circuit of a sub-pixel according to an embodiment of the disclosure.

FIG. 3 is a schematic diagram of an equivalent circuit of a sub-pixel according to an embodiment of the disclosure.

Referring to FIG. 3, each of the sub-pixels SPn of the display device 10 according to an embodiment may include three transistors T1, T2 and T3 and one storage capacitor Cst in addition to a light-emitting diode EL.

The light-emitting diode EL may emit light proportional to the current supplied through the first transistor T1. The light-emitting diode EL may include a first electrode, a second electrode, and at least one light-emitting element disposed therebetween. The light-emitting element may emit light in a particular wavelength range by an electric signal transmitted from the first electrode and the second electrode.

An end of the light-emitting diode EL may be connected to a source electrode of the first transistor T1, and another end thereof may be connected to the second voltage line VSL from which a low-level voltage (hereinafter referred to as a second supply voltage) lower than a high-level voltage (hereinafter referred to as a first supply voltage) of the first voltage line VDL may be applied. An end of the light-emitting diode EL may be connected to a source electrode of the second transistor T2

The first transistor T1 may adjust a current flowing from the first supply voltage line from which the first supply voltage may be supplied to the light-emitting diode EL according to the voltage difference between a gate electrode and the source electrode. For example, the first transistor T1 may be a driving transistor for driving the light-emitting diode EL. The gate electrode of the first transistor T1 may be connected to a source electrode of the second transistor T2, the source electrode thereof may be connected to the first electrode of the light-emitting diode EL, and the drain electrode thereof may be connected to the first voltage line VDL from which the first supply voltage may be applied.

The second transistor T2 may be turned on by a first scan signal of the first scan line SL1 to connect the data line DTL with the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 may be turned on by a second scan signal of the second scan line SL2 to connect the initialization voltage line VIL with one end of the light-emitting diode EL. The gate electrode of the third transistor T3 may be connected to the second scan line SL2, the drain electrode thereof may be connected to the initialization voltage line VIL, and the source electrode thereof may be connected to one end of the light-emitting diode EL or the source electrode of the first transistor T1.

The source electrode and the drain electrode of each of the transistors T1, T2 and T3 are not limited to those described above. They may be connected in the opposite way. Each of the transistors T1, T2 and T3 may be formed as a thin-film transistor. Although each of the transistors T1, T2 and T3 are implemented as an n-type MOSFET (metal oxide semiconductor field effect transistor) in the example shown in FIG. 3, the disclosure is not limited thereto. That is to say, each of the transistors T1, T2 and T3 may be implemented as a p-type MOSFET, or some of the transistors T1, T2 and T3 may be implemented as n-type MOSFETs while the others may be implemented as p-type MOSFETs.

The storage capacitor Cst may be formed between the gate electrode and the source electrode of the first transistor T1. The storage capacitor Cst may store a voltage difference between the gate voltage and the source voltage of the first transistor T1.

Hereinafter, the structure of one pixel PX of the display device 10 according to an embodiment will be described in detail with reference to other drawings.

Figure 4:
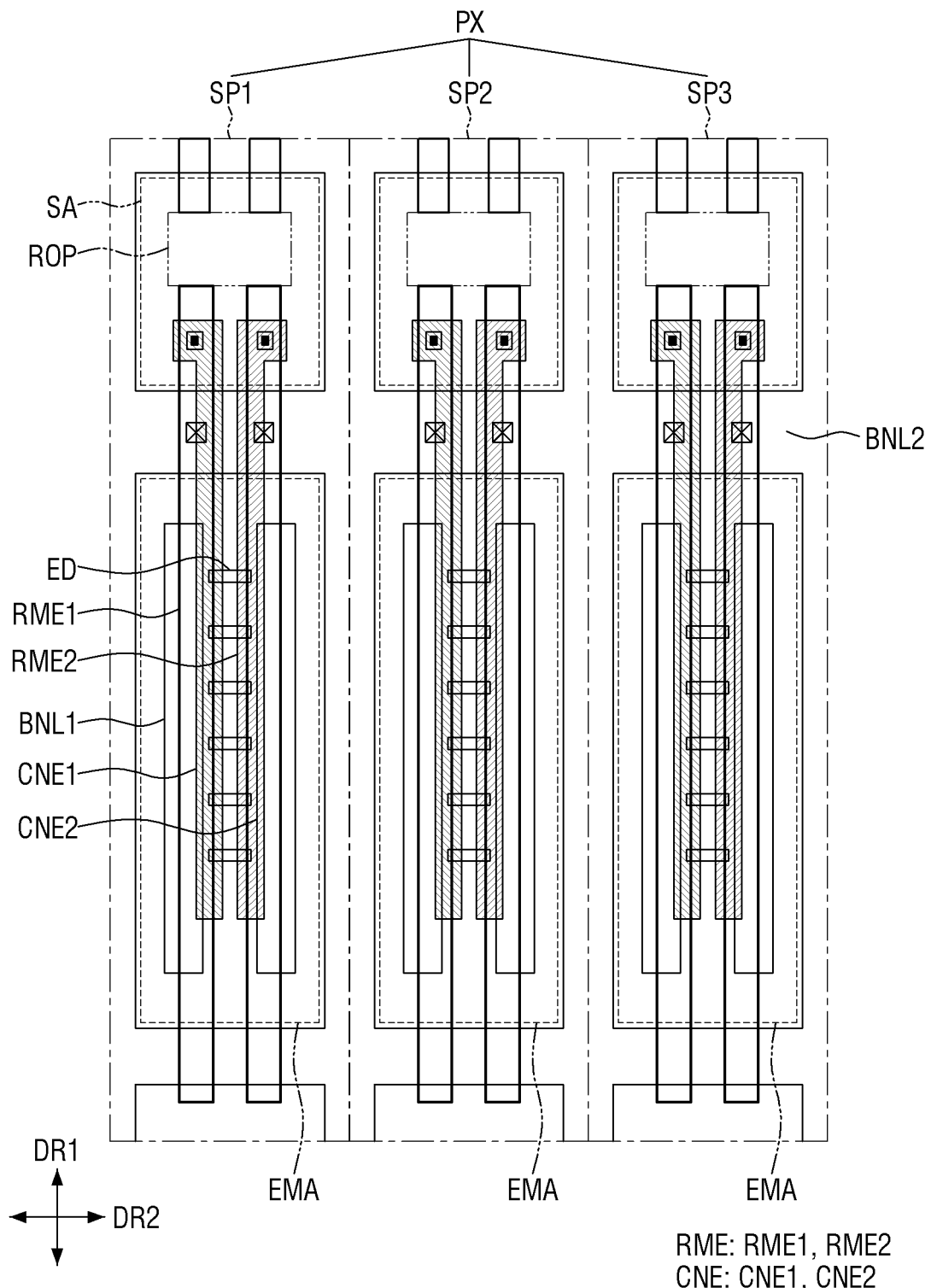
FIG. 4 is a schematic plan view showing a pixel of a display device according to an embodiment of the disclosure.

FIG. 4 is a schematic plan view showing a pixel of a display device according to an embodiment of the disclosure.

Referring to FIG. 4, each of the pixels PX of the display device 10 may include sub-pixels SPn, where n may be an integer from one to three. For example, a pixel PX may include a first sub-pixel SP1, a second sub-pixel SP2 and a third sub-pixel SP3. The first sub-pixel SP1 may emit light of a first color, the second sub-pixel SP2 may emit light of a second color, and the third sub-pixel SP3 may emit light of a third color. For example, the first color may be blue, the second color may be green, and the third color may be red. It is, however, to be understood that the disclosure is not limited thereto. All the sub-pixels SPn may emit light of the same color. According to an embodiment of the disclosure, the sub-pixels SPn may emit blue light. Although the single pixel PX includes three sub-pixels SPn in the example shown in FIG. 4, the disclosure is not limited thereto. For example, the pixel PX may include more than three sub-pixels SPn.

Each of the sub-pixels SPn of the display device 10 may include an emission area EMA and a non-emission area. In the emission area EMA, the light-emitting diodes ED may be disposed to emit light of a particular wavelength. In the non-emission area, no light-emitting element ED may be disposed and light emitted from the light-emitting diodes ED may not reach and thus no light exits therefrom. The emission area may include an area in which the light-emitting diodes ED may be disposed, and may include an area adjacent to the light-emitting diodes ED where lights emitted from the light-emitting element ED exit.

It is, however, to be understood that the disclosure is not limited thereto. The emission area EMA may also include an area in which light emitted from the light-emitting diode ED may be reflected or refracted by other elements to exit. The light-emitting diodes ED may be disposed in each of the sub-pixels SPn, and the emission area may include the area where the light-emitting elements may be disposed and the adjacent area.

Although the emission areas EMA of the sub-pixels SPn have substantially the uniform area in the example shown in the drawings, the disclosure is not limited thereto. In some embodiments, the emission areas EMA of the sub-pixels SPn may have different areas depending on a color or wavelength band of light emitted from the light-emitting diodes ED disposed in the respective sub-pixels.

Each of the sub-pixels SPn may further include a subsidiary area SA disposed in the non-emission area. The subsidiary area SA may be disposed on a side of the emission area EMA in the first direction DR1, and may be disposed between the emission areas EMA of the sub-pixels SPn adjacent to each other in the first direction DR1. For example, the emission areas EMA and the subsidiary areas SA may be arranged repeatedly in the second direction DR2, and may be arranged alternately in the first direction DR1. It is, however, to be understood that the disclosure is not limited thereto. The emission areas EMA and the subsidiary areas SA of the pixels PX may have an arrangement different from that of FIG. 4.

A second bank BNL2 may be disposed between the subsidiary areas SA and the emission areas EMA, and the distance between the subsidiary areas SA and the emission areas EMA may vary depending on the width of the second bank BNL2. No light-emitting diode ED may be disposed in the subsidiary areas SA and thus no light exits therefrom. The electrodes RME disposed in the sub-pixels SPn may be disposed (e.g., partially disposed) in the subsidiary areas SA. The electrodes RME disposed in different sub-pixels SPn may be disposed separately from one another in separation regions ROP of the subsidiary areas SA.

The second bank BNL2 may be disposed in a lattice pattern on the surface (e.g., entire surface) of the display area DPA including portions extended in the first direction DR1 and the second direction DR2 when viewed from the top. The second bank BNL2 may be disposed along the border of each of the sub-pixels SPn to distinguish adjacent sub-pixels SPn from one another. The second bank BNL2 may be disposed to surround the emission area EMA disposed in each of the sub-pixels SPn to distinguish between the sub-pixels.

Figure 5:
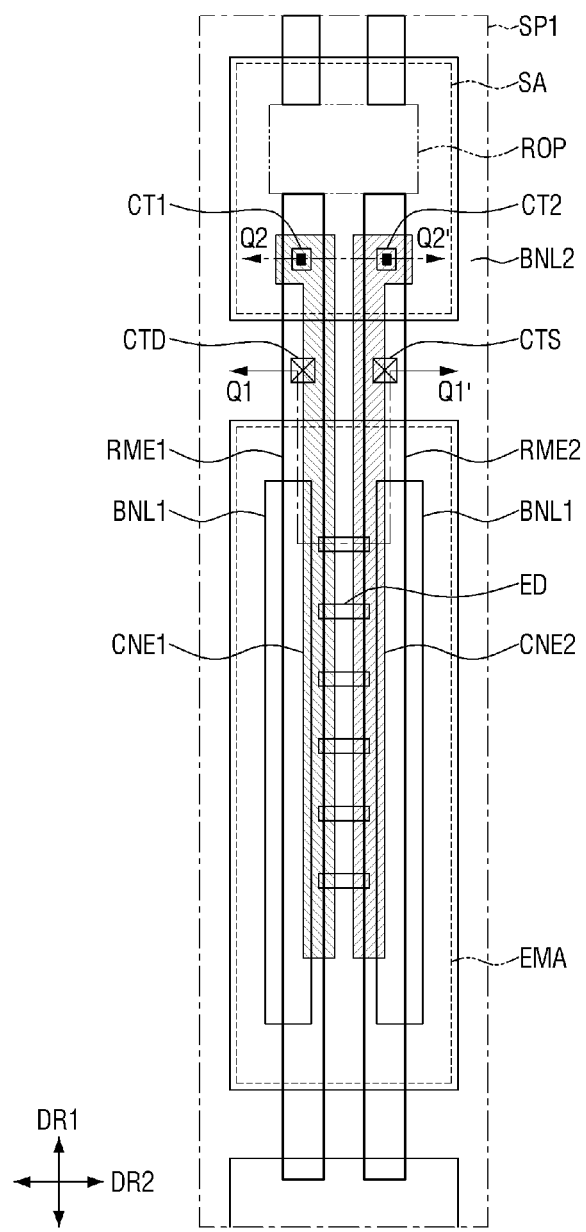
FIG. 5 is a schematic plan view showing the first sub-pixel of FIG. 3.
Figure 6:
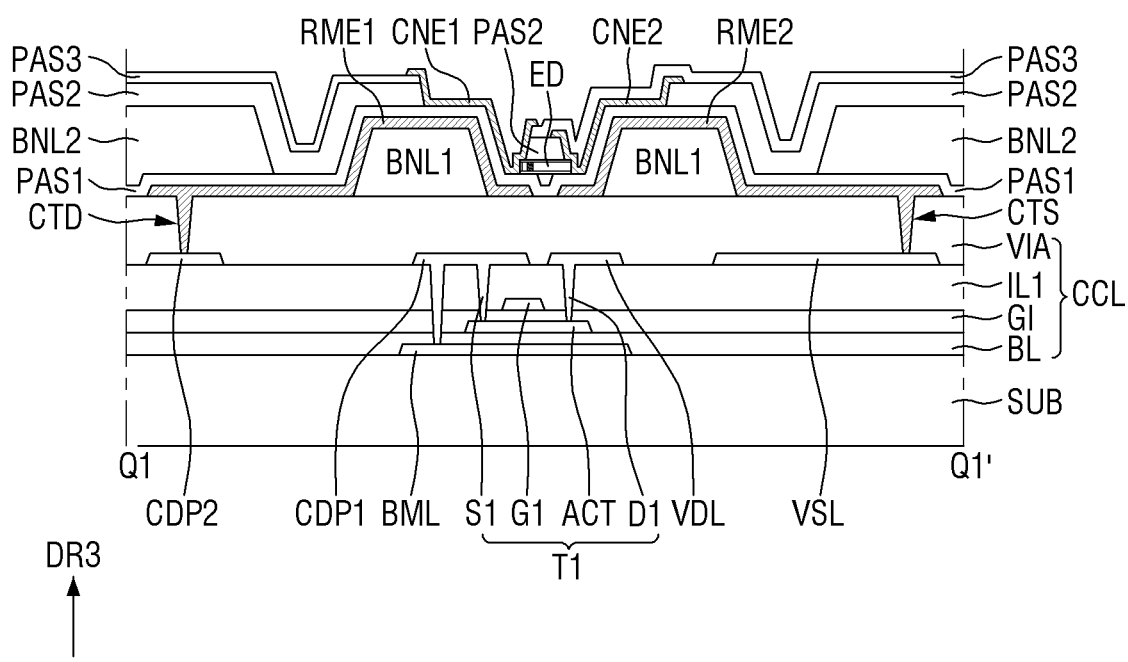
FIG. 6 is a schematic cross-sectional view taken along line Q1-Q1' of FIG. 5.
Figure 7:
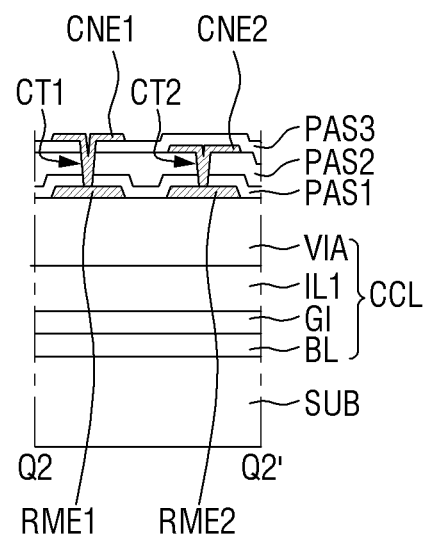
FIG. 7 is a schematic cross-sectional view taken along line Q2-Q2' of FIG. 5.

FIG. 5 is a schematic plan view showing the first sub-pixel of FIG. 3. FIG. 6 is a schematic cross-sectional view taken along line Q1-Q1' of FIG. 5. FIG. 7 is a schematic cross-sectional view taken along line Q2-Q2' of FIG. 5. FIG. 5 shows the first sub-pixel PX1 included in one pixel PX, and FIG. 6 shows a cross section passing through both ends of a light-emitting diode ED disposed in the first sub-pixel SP1. FIG. 7 is a view showing a cross section passing through multiple contacts CT1 and CT2 in the first sub-pixel SP1.

Referring to FIGS. 5 to 7 in conjunction with FIG. 4, the display device 10 may include a first substrate SUB, a semiconductor layer disposed on the first substrate SUB, multiple conductive layers, and multiple insulating layers. The semiconductor layer, the conductive layers and the insulating layers may form a circuit layer CCL and a display element layer of the display device 10.

The first substrate SUB may be an insulating substrate. The first substrate SUB may be made of an insulating material such as glass, quartz, a polymer resin, or a combination thereof. The first substrate SUB may be either a rigid substrate or a flexible substrate that can be bent, folded, or rolled.

A first conductive layer may be disposed on the first substrate SUB. The first conductive layer may include a bottom metal layer BML. The bottom metal layer BML, may be disposed to overlap an active layer ACT of a first transistor T1. The bottom metal layer BML may include a material that blocks light, and thus can prevent light from entering the active layer ACT of the first transistor T1. It is, however, to be noted that the bottom metal layer BML may be eliminated.

A buffer layer BL may be disposed on the bottom metal layer BML and the first substrate SUB. The buffer layer BL may be formed on the first substrate SUB to protect the transistors of the pixel PX from moisture permeating through the first substrate SUB that may be susceptible to moisture permeation, and may also provide a flat surface.

The semiconductor layer may be disposed on the buffer layer BL. The semiconductor layer may include the active layer ACT of the first transistor T1. The active layer ACT may be disposed to overlap (e.g., partially overlap) with a gate electrode G1 of a second conductive layer, which will be described later.

The semiconductor layer may include polycrystalline silicon, monocrystalline silicon, an oxide semiconductor, etc., or a combination thereof. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although only one first transistor T1 may be disposed in the sub-pixel SPn of the display device 10 in the drawing, the disclosure is not limited thereto. A larger number of transistors may be included in the display device 10.

A first gate insulator GI may be disposed on the semiconductor layer and the buffer layer BL. The first gate insulator GI may work as a gate insulating film of the first transistor T1.

The second conductive layer may be disposed on the first gate insulating layer GI. The second conductive layer may include a gate electrode G1 of the first transistor T1. The gate electrode G1 may be disposed so that it overlaps a channel region of the active layer ACT in the thickness direction, i.e., a third direction DR3.

A first interlayer dielectric layer IL1 may be disposed on the second conductive layer. The first interlayer dielectric layer IL1 may work as an insulating film between the second conductive layer and other layers disposed thereon and can protect the second conductive layer.

The third conductive layer may be disposed on the first interlayer dielectric layer IL1. The third conductive layer may include a first voltage line VDL, a second voltage line VSL, and multiple electrode patterns CDP1 and CDP2.

A high-level voltage (or the first supply voltage) may be applied to the first voltage line VDL to be transmitted to the first electrode RME1, and a low-level voltage (or the second supply voltage) may be applied to the second voltage line VSL to be transmitted to the second electrode RME2. A part of the first voltage line VDL may be in contact with the active layer ACT of the first transistor T1 through a contact hole penetrating the first interlayer dielectric layer IL1 and the first gate insulator GI. The first voltage line VDL may work as a first drain electrode D1 of the first transistor T1.

In some embodiments, the first voltage line VDL and the third voltage line VRL may each receive a first supply voltage, and the first transistor T1 may be connected to the third voltage line VRL. In this instance, the third voltage line VRL may work as the first drain electrode D1 of the first transistor T1. The first transistor T1 of each sub-pixel SPn may be connected to either the first voltage line VDL or the third voltage line VRL depending on the arrangement structure of the electrodes RME1 and RME2 to be described later, and the type of the lines to which the alignment signal may be applied in case that the light-emitting diodes ED may be aligned.

The first electrode pattern CDP1 may be in contact with the active layer ACT of the first transistor T1 through a contact hole penetrating the first interlayer dielectric layer IL1 and the first gate insulator GI. The first electrode pattern CDP1 may be in contact with the bottom metal layer BML through another contact hole. The first electrode pattern CDP1 may work as a first source electrode S1 of the first transistor T1.

The second electrode pattern CDP2 may be electrically connected to the first transistor T1 through the first electrode pattern CDP1. Although the first electrode pattern CDP1 and the second electrode pattern CDP2 may be spaced apart from each other in the drawings, the first electrode pattern CDP1 and the second electrode pattern CDP2 may be connected to each other directly or through a pattern on another layer. In some embodiments, the second electrode pattern CDP2 may be integrated with the first electrode pattern CDP1 to form a single pattern. The second electrode pattern CDP2 may also be connected to the first electrode RME1. The first transistor T1 may transfer the first supply voltage applied from the first voltage line VDL to the first electrode RME1.

Although the first electrode pattern CDP1 and the second electrode pattern CDP2 may be formed on the same layer in the drawings, the disclosure is not limited thereto. In some embodiments, the second electrode pattern CDP2 may be formed as a conductive layer different from the first electrode pattern CDP1, e.g., a fourth conductive layer disposed above the third conductive layer with some insulating layer between the third conductive layer and the fourth conductive layer. In this instance, the first voltage line VDL and the second voltage line VSL may also be formed as a fourth conductive layer rather than the third conductive layer. The first voltage line VDL may be electrically connected to the drain electrode D1 of the transistor T1 through a different conductive pattern. Although not shown in the drawings, each of the second conductive layer and the third conductive layer may further include a capacitor electrode of the storage capacitor. The capacitor electrodes of the storage capacitors may be disposed on different layers to form a capacitor in the first interlayer dielectric layer IL1 therebetween. In some embodiments, each of the capacitors of the storage capacitors may be formed integrally with the gate electrode G1 and the source electrode S1 of the first transistor T1. It is, however, to be understood that the disclosure is not limited thereto.

According to an embodiment of the disclosure, the first line VL1, the second line VL2 and the third line VL3 disposed in the non-display area NDA may also be formed as the third conductive layer. The first line VL1 may be formed on the same layer as the first voltage line VDL and may be integrally connected to each other. Similarly, the second line VL2 may also be formed on the same layer as the second voltage line VSL and may be integrally connected to each other. The third voltage line VRL (not shown) may also be formed as the third conductive layer, and the third line VL3 may be integrally connected with the third voltage line VRL. It is, however, to be understood that the disclosure is not limited thereto. In case that the first to third lines VL1, VL2 and VL3 are formed as different conductive layers, they may be connected to the first voltage line VDL, the second voltage line VSL and the third voltage line VRL through contact holes, respectively.

The buffer layer BL, the first gate insulator GI and the first interlayer dielectric layer IL1 may be made up of multiple inorganic layers stacked on one another alternately. For example, the buffer layer BL, the first gate insulating layer GI and the first interlayer dielectric layer IL1 may be made up of a double layer in which inorganic layers including at least one of silicon oxide (SiOx), silicon nitride (SiNx) and silicon oxynitride (SiON) may be stacked on one another or multiple layers in which they may be alternately stacked on one another. It is, however, to be understood that the disclosure is not limited thereto. The buffer layer BL, the first gate insulating layer GI and the first interlayer dielectric layer IL1 may be made up of a single inorganic layer including the above-described insulating material. In some embodiments, the first interlayer dielectric layer IL1 may be made of an organic insulating material such as polyimide (PI).

The second conductive layer and the third conductive layer may be made up of a single layer or multiple layers of at least one of molybdenum (Mo), aluminum (Al), chromium (Cr), gold (Au), titanium (Ti), nickel (Ni), neodymium (Nd) and copper (Cu), or an alloy thereof. It is, however, to be understood that the disclosure is not limited thereto.

A via layer VIA may be disposed on the third conductive layer. The via layer VIA may include an organic insulating material, e.g., an organic insulating layer material such as polyimide (PI), to provide a flat surface.

Multiple electrodes RME; RME1 and RME2, multiple first banks BNL1 and a second bank BNL2, multiple light-emitting diodes ED, and multiple connection electrodes CNE; CNE1 and CNE2 may be disposed on the via layer VIA. Multiple insulating layers PAS1, PAS2 and PAS3 may be disposed on the via layer VIA.

The first banks BNL1 may be disposed directly on the via layer VIA. The first banks BNL1 may have a shape extended in the first direction DR1 and may be spaced apart from each other in the second direction DR2. For example, the first banks BNL1 may be extended in the first direction DR1 in the emission area EMA and may be disposed on the sides of the center of the emission area EMA in the second direction DR2. The first banks BNL1 may be spaced apart from each other in the second direction DR2, and light-emitting diodes ED may be disposed therebetween.

The length of the first banks BNL1 extended in the first direction DR1 may be smaller than the length of the emission area EMA in the first direction DR1 surrounded by the second bank BNL2. The first banks BNL1 may be disposed in the emission area EMA of the sub-pixel SPn to form an island-like (e.g., isolated) pattern that has a small width and may be extended in one direction on the front surface of the display area DPA.

The first banks BNL1 may have a structure that at least partly protrudes from the upper surface of the via layer VIA. The protrusions of the first banks BNL1 may have inclined side surfaces. The light emitted from the light-emitting diodes ED may be reflected by the electrodes RME disposed on the first banks BNL1 so that the light may exit toward the upper side of the via layer VIA. It is, however, to be understood that the disclosure is not limited thereto. The first banks BNL1 may have a shape of a semi-circle or semi-ellipse having a curved outer surface. The first bank BNL1 may include, but is not limited to, an organic insulating material such as polyimide (PI).

The electrodes RME may have a shape extended in a direction and may be disposed in each of the sub-pixels SPn. The electrodes RME may be extended in the first direction DR1 to be disposed across at least the emission area EMA and the subsidiary area SA of the sub-pixel SPn, and they may be spaced apart from one another in the second direction DR2.

The first electrode RME1 and the second electrode RME2 spaced apart from each other in the second direction DR2 may be disposed in each of the sub-pixels SPn. The first electrode RME1 and the second electrode RME2 may be spaced apart in the emission area EMA in the first direction DR1, and may go over (e.g., overlap) the second bank BNL2 to be disposed in the sub-pixel SPn and disposed (e.g., partially disposed) in the subsidiary area SA of another sub-pixel SPn adjacent to the sub-pixel SPn in the first direction DR1. The first electrode RME1 and the second electrode RME2 of a sub-pixel SPn may be spaced apart from those of another sub-pixel SPn at the separation region ROP located in the subsidiary area SA of one of the sub-pixels SPn.

Such arrangement of the electrodes RME may be formed by forming single electrode lines extended in the first direction DR1 and disposing the light-emitting diodes ED thereon, and separating the electrode lines into parts during a subsequent process. The electrode line may be used to generate an electric field in the sub-pixel SPn to align the light-emitting diodes ED during the process of fabricating the display device 10. After aligning the light-emitting diodes ED, the electrode lines may be separated at the separation region ROP, such that the electrodes RME spaced apart from each other in the first direction DR1 may be formed.

The first electrode RME1 and the second electrode RME2 may be disposed on different first banks BNL1, respectively. The first electrode RME1 may be disposed on the left side of the center of the emission area EMA and may be disposed (e.g., partially disposed) on the first bank BNL1 disposed on the left side. The second electrode RME2 may be spaced apart from the first electrode RME1 in the second direction DR2 and may be disposed on the right side of the center of the emission area EMA. A part of the second electrode RME2 may be disposed on the first bank BNL1 disposed on the right side.

The electrodes RME may be disposed at least on the inclined side surfaces of the first banks BNL1. According to an embodiment of the disclosure, the width of the electrodes RME measured in the second direction DR2 may be smaller than the width of the first banks BNL1 or the second bank BNL2 measured in the second direction DR2. Each of the electrodes RME may be disposed to cover at least one side surface of the respective first banks BNL1 to reflect light emitted from the light-emitting diodes ED.

The distance between the electrodes RME spaced apart in the second direction DR2 may be smaller than the distance between the first banks BNL1. At least a part of each of the electrodes RME may be disposed directly on the via layer VIA so that they may be disposed on a same plane.

The first electrode RME1 and the second electrode RME2 may be connected to the third conductive layer through a first electrode contact hole CTD and a second electrode contact hole CTS, respectively, which may be formed at such locations that they overlap with the second bank BNL2. The first electrode RME1 may be in contact with the second electrode pattern CDP2 through the first contact hole CTD penetrating through the via layer VIA thereunder. The second electrode RME2 may be in contact with the second voltage line VSL through the second contact hole CTS penetrating through the via layer VIA thereunder. The first electrode RME1 may be electrically connected to the first transistor T1 through the second electrode pattern CDP2 and the first electrode pattern CDP1 to receive the first supply voltage. The second electrode RME2 may be electrically connected to the second voltage line VSL to receive the second supply voltage.

It is, however, to be understood that the disclosure is not limited thereto. In some embodiments, the first electrode RME1 may be electrically connected to the second voltage line VSL, and the second electrode RME2 may be electrically connected to the first voltage line VDL. As will be described later, this may vary with the arrangement of the electrodes and the arrangement of the light-emitting diodes ED in the sub-pixel SPn depending on the type of the lines used to align the light-emitting diodes ED. Although the first electrode contact hole CTD and the second electrode contact hole CTS may be formed under the second bank BNL2 in the drawings, the disclosure is not limited thereto. They may be formed at other locations. For example, the first electrode contact hole CTD and the second electrode contact hole CTS may be formed in the emission area EMA or the subsidiary area SA.

The electrodes RME may be electrically connected to the light-emitting diodes ED. The electrodes RME may be connected to the light-emitting diodes ED through the connection electrodes CNE; CNE1 and CNE2 to be described below, and may transmit electric signals applied from a conductive layer thereunder to the light-emitting diodes ED.

Each of the electrodes RME may include a conductive material having a high reflectance. For example, the electrodes RME may include a metal such as at least one of silver (Ag), copper (Cu) and aluminum (Al) as the material having a high reflectance, and may be an alloy including aluminum (Al), nickel (Ni), lanthanum (La), etc. The electrodes RME may reflect light that may be emitted from the light-emitting diodes ED and travels toward the side surfaces of the first banks BNL1 toward the upper side of each of the sub-pixels SPn.

It is, however, to be understood that the disclosure is not limited thereto. The electrodes RME may further include a transparent conductive material. For example, each of the electrodes RME may include a material such as ITO, IZO, ITZO, or a combination thereof. In some embodiments, each of the electrodes RME1 and RME2 may have a structure in which one or more layers of a transparent conductive material and one or more metal layers having high reflectivity may be stacked on one another, or may be made up of a single layer including the materials. For example, each of the electrodes RME may have a stack structure such as ITO/Ag/ITO, ITO/Ag/IZO, or ITO/Ag/ITZO/IZO.

The first insulating layer PAS1 may be disposed on the via layer VIA and the electrodes RME. The first insulating layer PAS1 may be disposed to cover the electrodes RME entirely, and can protect the electrodes RME and insulate them from one another. The first insulating layer PAS1 can also prevent that the light-emitting diodes ED disposed thereon may be brought into contact with other elements and damaged.

In an embodiment, the first insulating layer PAS1 may have steps so that a part of the upper surface may be recessed between the electrodes RME spaced apart from one another in the second direction DR2. The light-emitting diodes ED may be disposed at the steps of the upper surface of the first insulating layer PAS1, and space may be formed between the light-emitting diodes ED and the first insulating layer PAS1.

The first insulating layer PAS1 may include multiple contacts CT1 and CT2 exposing a part of the upper surface of each of the electrodes RME. The contacts CT1 and CT2 may penetrate through the first insulating layer PAS1, and the connection electrodes CNE described later may be in contact with the electrodes RME exposed through the contacts CT1 and CT2.

The second bank BNL2 may be disposed on the first insulating layer PAS1. The second bank BNL2 may be disposed in a lattice pattern including parts extended in the first direction DR1 and the second direction DR2 when viewed from the top, and may be disposed at the boundaries of the sub-pixels SPn to distinguish the adjacent sub-pixels SPn from each other. The second bank BNL2 may be disposed to surround the emission area EMA and the subsidiary area SA, and the areas defined and opened by the second bank BNL2 may be the emission area EMA and the subsidiary area SA, respectively.

The second bank BNL2 may have a predetermined height. In some embodiments, the upper surface of the second bank BNL2 may be higher than that of the first bank BNL1, and the thickness thereof may be equal to or greater than that of the first bank BNL1. The second bank BNL2 can prevent an ink from overflowing into adjacent sub-pixels SPn during an inkjet printing process of the process of fabricating the display device 10. The second bank BNL2 can separate the different sub-pixels SPn from one another so that the ink in which different light-emitting diodes ED may be dispersed may not be mixed. The second bank BNL2 may include, but is not limited to, polyimide, like the first bank BNL1.

The light-emitting diodes ED may be disposed on the first insulating layer PAS1. The light-emitting diodes ED may include multiple layers disposed on the upper surface of the first substrate SUB in the direction parallel to it. The light-emitting elements ED of the display device 10 may be arranged such that they may be extended in parallel to the first substrate SUB. The multiple semiconductor layers included in the light-emitting elements ED may be disposed sequentially in the direction parallel to the upper surface of the first substrate SUB. It is, however, to be understood that the disclosure is not limited thereto. In some implementations, in case that the light-emitting diodes ED have a different structure, multiple layers may be disposed in a direction perpendicular to the first substrate SUB.

The light-emitting diodes ED may be disposed on the electrodes RME spaced apart from each other in the second direction DR2 between the first banks BNL1. The light-emitting diodes ED may be spaced apart from one another in the first direction DR1 in which the electrodes RME may be extended, and may be aligned substantially parallel to one another. The light-emitting diodes ED may have a shape extended in a direction, and may have a length larger than the distance between electrodes RME spaced apart from one another in the second direction DR2. The ends of each of the light-emitting diodes ED may be disposed on different electrodes RME, and the direction in which the electrodes RME may be extended may be substantially perpendicular to the direction in which the light-emitting diodes ED may be extended. It is, however, to be understood that the disclosure is not limited thereto. The light-emitting diodes ED may be oriented obliquely to the direction in which the electrodes RME may be extended.

The light-emitting diodes ED disposed in each of the sub-pixels SPn may emit light of different wavelength bands depending on the material of the semiconductor layer. It is, however, to be understood that the disclosure is not limited thereto. The light-emitting diodes ED disposed in each of the sub-pixels SPn may emit light of the same color. The light-emitting diodes ED may include semiconductor layers doped with impurities of different conductivity types and may be aligned so that their ends may be directed in a particular orientation depending on the electric field generated over the electrodes RME.

Each of the light-emitting diodes ED may include multiple semiconductor layers, and a first end and a second end opposite to the first end may be defined with respect to one of the semiconductor layers. The light-emitting diode ED may have the first end disposed on the first electrode RME1 and the second end disposed on the second electrode RME2. The first end of the light-emitting diode ED may face the opposite direction to the second direction DR2, e.g., the left side.

The light-emitting diodes ED may be in contact with the connection electrodes CNE: CNE1 and CNE2 so that they may be electrically connected to the electrodes RME. As a part of the semiconductor layer of each of the light-emitting diodes ED may be exposed at the end surface on one side of the direction in which they may be extended, the exposed part of the semiconductor layer may be in contact with the contact electrode CNE. Each of the light-emitting diodes ED may be electrically connected to the electrodes RME or the conductive layers under the via layer VIA through the connection electrodes CNE, and an electric signal may be applied so that light of a particular wavelength range can be emitted.

The second insulating layer PAS2 may be disposed on the light-emitting diodes ED. For example, the second insulating layer PAS2 may be disposed to surround (e.g., partially surround) the outer surfaces of the light-emitting diodes ED so that the sides or ends of the light-emitting diodes ED may not be covered. The part of the second insulating layer PAS2 which may be disposed on the light-emitting diode ED may be extended in the first direction DR1 on the first insulating layer PAS1 when viewed from the top, thereby forming a linear or island-like (e.g., isolated) pattern in each of the sub-pixels SPn. The second insulating layer PAS2 can protect the light-emitting diodes ED and fix the light-emitting diodes ED during the process of fabricating the display device 10. The second insulating layer PAS2 may be disposed to fill the space between light-emitting diodes ED and the first insulating layer PAS1 thereunder.

The second insulating layer PAS2 may be disposed also on the first banks BNL1 or the second bank BNL2. The second insulating layer PAS2 may be disposed on the first insulating layer PAS1, and may be disposed to expose some parts where the electrodes RME may be disposed together with the sides of the light-emitting diodes ED. The second insulating layer PAS2 may have such a shape as it may be formed entirely on the first insulating layer PAS1 during the process of fabricating the display device 10 and may be removed during the process of exposing both sides of the light-emitting diodes ED.

The second insulating layer PAS2 may be disposed (e.g., partially disposed) in the subsidiary area SA as well. During the process of disposing the light-emitting diodes ED and separating the electrode line into parts, the first insulating layer PAS1 and the second insulating layer PAS2 may be removed (e.g., partially removed) as well. A part of the via layer VIA may be exposed at the separation regions ROP. The third insulating layer PAS3 may be disposed directly on the exposed part of the via layer VIA.

Multiple connection electrodes CNE:CNE1 and CNE2 and the third insulating layer PAS3 may be disposed on the second insulating layer PAS2.

The connection electrodes CNE may be disposed on the light-emitting diodes ED and the electrodes RME. The connection electrodes CNE may be disposed (e.g., partially disposed) on the second insulating layer PAS2 and may be insulated from one another by the other connection electrodes CNE, the second insulating layer PAS2 and the third insulating layer PAS3. The connection electrodes CNE may be in contact with the light-emitting diodes ED and the electrodes RME. The connection electrodes CNE may be in direct contact with the semiconductor layer exposed at the end surfaces of the light-emitting diodes ED, and may be in contact with at least one of the electrodes RME through the contacts CT1 and CT2 penetrating through the first insulating layer PAS1. The ends of the light-emitting diodes ED may be electrically connected to the electrodes RME through the connection electrodes CNE1 and CNE2.

The first connection electrode CNE1 may have a shape extended in the first direction DR1 and may be disposed on the first electrode RME1. The first connection electrode CNE1 may be in contact with the first electrode RME1 through the first contact CT1 exposing the upper surface of the first electrode RME1, and may be in contact with the first end of each of the light-emitting diodes ED. The second connection electrode CNE2 may have a shape extended in the first direction DR1 and may be disposed on the second electrode RME2. The second connection electrode CNE2 may be in contact with the second electrode RME2 through the second contact CT2 exposing the upper surface of the second electrode RME2, and may be in contact with the second end of each of the light-emitting diodes ED. The first contact electrode CNE1 and the second contact electrode CNE2 may transmit electric signals applied to the first electrodes RME1 and the second electrode RME2 to one of the ends of each of the light-emitting diodes ED.

The connection electrodes CNE may be spaced apart from one another in the second direction DR2 when viewed from the top. The first connection electrode CNE1 and the second connection electrode CNE2 may be spaced apart from each other by a predetermined distance so that they may not be directly connected to each other. The different connection electrodes CNE may be spaced apart from one another so that they may not be connected to one another, and may be insulated from one another by the third insulating layer PAS3 disposed therebetween.

The contacts CT1 and CT2 may be formed so that they do not overlap with the light-emitting diodes ED in the second direction DR2. For example, the contacts CT1 and CT2 may be formed such that they may be spaced apart in the first direction DR1 from the area where light-emitting diodes ED may be disposed. Lights may be emitted from the ends of the light-emitting diodes ED, and the contact holes CT1 and CT2 may be located to avoid the paths of the lights. Although the contacts CT1 and CT2 may be formed in the subsidiary area SA in the drawings, the disclosure is not limited thereto. The contacts CT1 and CT2 may be formed in a part of the emission area EMA where the light-emitting diodes ED may not be disposed. In this instance, it may be possible to reduce the light emitted from the light-emitting diodes ED from being reflected and refracted at the contacts CT1 and CT2, and it may be possible to prevent the light-emitting diodes ED from sticking together around the contact holes by the contacts CT1 and CT2 exposing the upper surfaces of the electrode lines during the process of fabricating the display device 10.

The connection electrodes CNE may include a conductive material. For example, the connection electrodes CNE may include at least one of ITO, IZO, ITZO, aluminum (Al), etc. For example, the connection electrodes CNE may include a transparent conductive material, and light emitted from the light-emitting diodes ED may transmit the connection electrodes CNE to proceed toward the electrodes RME. It is, however, to be understood that the disclosure is not limited thereto.

The third insulating layer PAS3 may be disposed on the second connection electrode layer CNE2 and the second insulating layer PAS2. The third insulating layer PAS3 may be disposed entirely on the second insulating layer PAS2 to cover the second connection electrode CNE2, and the first connection electrode layer CNE1 may be disposed on the third insulating layer PAS3. The third insulating layer PAS3 may be disposed entirely on the via layer VIA except for the locations where the first connection electrode layer CNE may be disposed. That is to say, the third insulating layer PAS3 may also be disposed on the first banks BNL1 and the second bank BNL2 in addition to the first insulating layer PAS1 and the second insulating layer PAS2. The third insulating layer PAS3 may insulate the first connection electrode CNE1 and the second connection electrode CNE2 from each other so that they may not be in direct contact with each other.

In some embodiments, the third insulating layer PAS3 may be eliminated from the display device 10. Accordingly, the connection electrodes CNE may be disposed directly on the second insulating layer PAS2, and may be disposed on substantially the same layer.

Although not shown in the drawings, another insulating layer may be further disposed on the first connection electrode layer CNE1 and the third insulating layer PAS3. The insulating layer may protect the elements disposed thereon against the external environment.

Each of the above-described first insulating layer PAS1, second insulating layer PAS2 and third insulating layer PAS3 may include an inorganic insulating material or an organic insulating material. It is, however, to be understood that the disclosure is not limited thereto.

Figure 8:
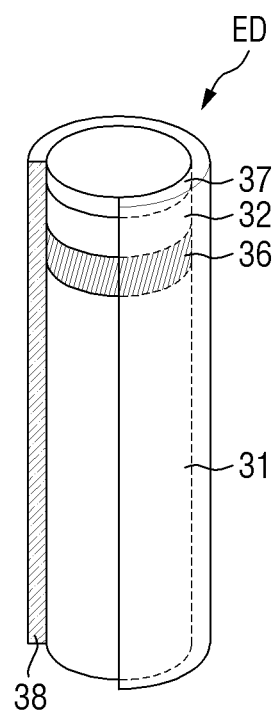
FIG. 8 is a schematic view showing a light-emitting element according to an embodiment of the disclosure.

FIG. 8 is a schematic view showing a light-emitting element according to an embodiment of the disclosure.

Referring to FIG. 8, a light-emitting element ED may be a light-emitting diode. Specifically, the light-emitting element ED may have a size from nanometers to micrometers and may be an inorganic light-emitting diode made of an inorganic material. The light-emitting diode ED may be aligned between two electrodes facing each other as polarities may be created by forming an electric field in a particular direction between the two electrodes.

The light-emitting diode ED according to an embodiment may have a shape extended in a direction. The light-emitting element ED may have a shape of a cylinder, a rod, a wire, a tube, etc. It is to be understood that the shape of the light-emitting diode ED is not limited thereto. The light-emitting diode ED may have a variety of shapes including a polygonal column shape such as a cube, a cuboid and a hexagonal column, or a shape that may be extended in a direction with inclined (e.g., partially inclined) outer surfaces.

The light-emitting diode ED may include semiconductor layers doped with impurities of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, the first semiconductor layer 31 may be one or more of n-type doped AlGaInN, GaN, AlGaN, InGaN, AlN and InN. The n-type dopant doped into the first semiconductor layer 31 may be Si, Ge, Sn, etc., or a combination thereof.

The second semiconductor layer 32 may be disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \le x \le 1$, $0 \le y \le 1$, $0 \le x+y \le 1$). For example, the second semiconductor layer 32 may be one or more of p-type doped AlGaInN, GaN, AlGaN, InGaN, AlN and InN. The p-type dopant doped into the second semiconductor layer 32 may be Mg, Zn, Ca, Se, Ba, etc., or a combination thereof.

Although each of the first semiconductor layer 31 and the second semiconductor layer 32 may be implemented as a signal layer in the drawings, the disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. In case that the emissive layer 36 includes a material having the multiple quantum well structure, the structure may include quantum layers and well layers alternately stacked on one another. The emissive layer 36 may emit light as electron-hole pairs may be combined therein in response to an electrical signal applied through the first semiconductor layer 31 and the second semiconductor layer 32. The emissive layer 36 may include a material such as AlGaN and AlGaInN. In particular, in case that the emissive layer 36 has a multi-quantum well structure in which quantum layers and well layers may be alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic connection electrode. It is, however, to be understood that the disclosure is not limited thereto. The electrode layer 37 may be a Schottky connection electrode. The light-emitting diode ED may include at least one electrode layer 37. The light-emitting diode ED may include one or more electrode layers 37. It is, however, to be understood that the disclosure is not limited thereto. The electrode layer 37 may be eliminated.

The electrode layer 37 can reduce the resistance between the light-emitting element ED and the electrodes or the connection electrodes in case that the light-emitting element ED may be electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO.

The insulating film 38 may be disposed to surround the outer surfaces of the semiconductor layers and electrode layers described above. For example, the insulating film 38 may be disposed to surround at least the outer surface of the emissive layer 36, with both ends of the light-emitting element ED in the longitudinal direction exposed. A part of the upper surface of the insulating film 38 may be rounded in cross section, which may be adjacent to at least one of the ends of the light-emitting diode ED.

The insulating film 38 may include materials having insulating properties such as silicon oxide (SiOx), silicon nitride (SiNx), silicon oxynitride (SiOxNy), aluminum nitride (AlNx), aluminum oxide (AlOx), or a combination thereof. Although the insulating film 38 may be formed as a single layer in the drawings, the disclosure is not limited thereto. In some embodiments, the insulating film 38 may be made up of a multilayer structure in which multiple layers may be stacked on one another.

The insulating film 38 may serve to protect the above-described elements. The insulating film 38 can prevent an electrical short-circuit that may occur in the emissive layer 36 if it comes in direct contact with an electrode through which an electric signal may be transmitted to the light-emitting diode ED. The insulating film 38 can prevent a decrease in luminous efficiency.

The outer surface of the insulating film 38 may be subjected to surface treatment. The light-emitting diodes ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

As described above, the electrodes RME may be formed as electrode lines extended in the first direction DR1 and may be used to align the light-emitting diodes ED. The electrodes RME disposed in the sub-pixels SPn arranged in the first direction DR1 may be formed as a single electrode line, and the light-emitting diodes ED may be arranged in the sub-pixels SPn arranged in the first direction DR1 by the same electrode line. According to an embodiment of the disclosure, multiple electrode lines may be electrically connected to multiple sub-lines VL1, VL2 and VL3 disposed in the non-display area NDA to apply an alignment voltage required for aligning the light-emitting diodes ED. Once the light-emitting diodes ED have been aligned, the electrode line may be separated into parts at the subsidiary area SA of each of the sub-pixels SPn to form multiple electrodes RME. Multiple conductive patterns EP1, EP2 and EP3 (see FIG. 9) may remain between the display area DPA and the non-display area NDA as residues of the separated electrode line.

Figure 9:
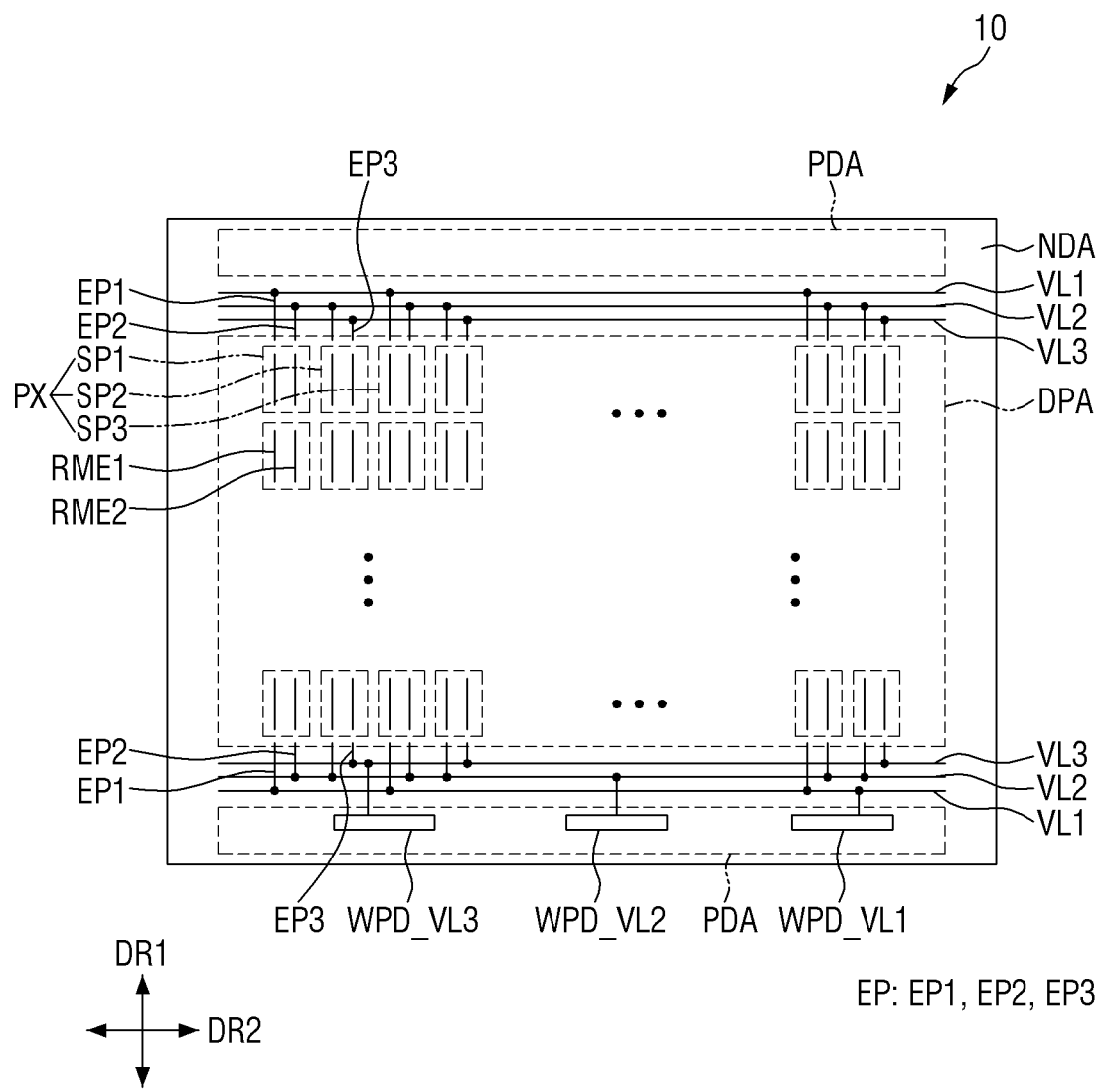
FIG. 9 is a schematic view showing arrangement of lines of a display device and electrodes disposed in sub-pixels according to an embodiment of the disclosure.

FIG. 9 is a schematic view showing arrangement of lines of a display device and electrodes disposed in sub-pixels according to an embodiment of the disclosure. FIG. 9 schematically shows the sub-lines VL1, VL2 and VL3 formed as the third conductive layer disposed in the non-display area NDA, and electrodes RME; RME1 and RME2 disposed in the sub-pixels SPn in the display area DPA. In FIG. 9, the structure is briefly shown to illustrate the arrangement relationship between the sub-lines VL1, VL2 and VL3 and the electrodes RME, and the structures of the elements can be understood through other drawings.

Referring to FIG. 9, the display device 10 may include the sub-lines VL1, VL2 and VL3 disposed on each of the sides of the display area DPA in the first direction DR1. Among the sub-lines VL1, VL2 and VL3, the first sub-line VL1 may be disposed adjacent to the pad area PDA of the non-display area NDA, and the second sub-line VL2 and the third sub-line VL3 may be disposed in this order toward the display area DPA from the first sub-line VL1. In the areas between the display area DPA and the pad area PDA, the first sub-lines VL1 may be disposed at the outermost positions adjacent to the pad area PDA, respectively, and the second sub-lines VL2 and the third sub-lines VL3 may be sequentially disposed on the inner side from the first sub-lines VL1 toward the display area DPA. Although not shown in the drawings, the first sub-lines VL1 disposed on the sides of the display area DPA in the first direction DR1 may be connected to each other through a first voltage line VDL, the second sub-lines VL2 may be connected to each other through a second voltage line VSL, and the third sub-lines VL3 may be connected to each other through a third voltage line VRL.

In the display area DPA, sub-pixels SPn and pixels PX may be arranged in the first direction DR1 and the second direction DR2. The first electrode RME1 and the second electrode RME2 extended in the first direction DR1 may be disposed in each of the sub-pixels SPn, and may be spaced apart from the electrodes RME disposed in another sub-pixel SPn arranged in the first direction DR1. The electrodes RME arranged in line with one another in the first direction DR1 may be formed by separating a single electrode line. The electrode line may traverse the display area DPA and may be disposed across the sub-lines VL1, VL2 and VL3 disposed between the pad areas PDA and the display area DPA. Once the electrode line may be separated into parts at the subsidiary area SA of each of the sub-pixels SPn, residues of the separated electrode line may remain between the electrodes RME of the sub-pixel SPn adjacent to the non-display area NDA on each of the sides in the first direction DR1 and the sub-lines VL1, VL2 and VL3.

According to an embodiment of the disclosure, the display device 10 may include the conductive patterns EP; EP1, EP2 and EP3 disposed between the sub-pixels SPn at the outermost positions of the display area DPA and the non-display area NDA on the sides in the first direction DR1. The conductive patterns EP may have a shape extended in the first direction DR1 and may be spaced apart from the electrodes RME disposed in the display area DPA in the first direction DR1. Since the conductive patterns EP were formed as a single electrode line together with the electrodes RME of the sub-pixel SPn, they may be arranged in line with them in the first direction DR1. A part of the conductive patterns EP may be disposed in the subsidiary area SA of the sub-pixels SPn in the outermost positions of the display area DPA in the first direction DR1, and may be spaced apart from the electrodes RME of the sub-pixels SPn arranged at the outermost positions in the first direction DR1. The conductive patterns EP may be extended in the first direction DR1 from the subsidiary area SA of the sub-pixel SPn to a part of the sub-lines VL1, VL2 and VL3.

In an embodiment where two electrodes spaced apart from each other, e.g., the first electrode RME1 and the second electrode RME2 may be disposed in a single sub-pixel SPn, different alignment voltages may be applied to the electrode lines from which the first electrode RME1 and the second electrode RME2 may be derived in order to align the light-emitting diodes ED. The alignment voltages may be applied from an external device to the sub-lines VL1, VL2 and VL3 through wire pads WPD_VL1, WPD_VL2 and WPD_VL3 connected thereto.

In the display device 10 according to an embodiment of the disclosure, the number of lines VL1, VL2 and VL3 used to align the light-emitting diodes ED may be larger than the number of the electrodes RME disposed in each of the sub-pixels SPn. Among the sub-lines VL1, VL2 and VL3, some of the lines may be used for aligning the light-emitting diodes ED in certain sub-pixels SPn, while others of the lines may be used for aligning the light-emitting diodes ED in all of the sub-pixels SPn disposed in the display area DPA. For example, the first sub-line VL1 and the third sub-line VL3 may be used to align the light-emitting diodes ED in certain of the sub-pixels SPn among the sub-pixels SPn, while the second sub-line VL2 may be utilized in all of the sub-pixels SPn. In certain of the sub-pixels SPn, a pair of electrode lines connected to the first sub-line VL1 and the second sub-line VL2, respectively, may align the light-emitting diodes ED, while in others of the sub-pixels SPn, a pair of electrode lines connected to the second sub-line VL2 and the third sub-line VL3, respectively, may align the light-emitting diodes ED. According to an embodiment of the disclosure, a voltage of a certain magnitude may be applied to one of the pair of electrode lines while the other one thereof may be grounded. An electric field may be generated due to a voltage difference between the grounded electrode line and the electrode line to which the voltage of the magnitude may be applied. The positions and orientations of the light-emitting diodes ED may be changed by the electric field, while they seat on the electrodes RME.

Alignment voltages for the alignment may be applied to the lines using an external device. In case that a signal application pad of an external device is connected to the wire pads WPD_VL1, WPD_VL2 and WPD_VL3, there may be a resistance due to the contact between the pads. The magnitude of the voltage applied to the display area DPA may become weaker depending on the magnitude of the contact resistance. The contact resistance between the pads may be a fixed value at a certain level based on the performance of the external device. Accordingly, the magnitude of the resistance cannot be easily controlled. If an alignment voltage of higher level is applied in order to compensate for the contact resistance, the electrodes RME of the display area DPA and the sub-lines VL1, VL2 and VL3 may be damaged by the voltage of the higher level.

According to an embodiment of the disclosure, the sub-pixels SPn may be sorted by the types of the sub-lines VL1, VL2 and VL3 connected to their electrode lines. An alignment voltage may be applied to one of a pair of electrode lines through the first sub-line VL1 or the third sub-line VL3, while the other one of the pair of the electrode line may be grounded through the second sub-line VL2 in each of the sub-pixels SPn. By applying alignment voltages through different lines to different sub-pixels SPn, instead of applying a signal through a single electric signal line and a ground line to all of the sub-pixels SPn, it may be possible to prevent the magnitude of the voltage from becoming weaker due to the contact resistance. By applying alignment signals through the different sub-lines VL1, VL2 and VL3 to different sub-pixels SPn of the display device 10, it may be possible to prevent or reduce the influence due to the contact resistance between the pads without increasing the magnitude of the voltage. By doing so, the display device 10 can prevent that the light-emitting diodes ED may not be aligned or there may be deviations in the alignment degree between the sub-pixels SPn as a result of insufficient magnitude of the voltage applied to the sub-pixels SPn.

According to an embodiment, in each of the sub-pixels SPn of the display device 10, one of the first electrode RME1 and the second electrode RME2 may be derived from an electrode line connected to the second sub-line VL2, while the other electrode may be derived from an electrode line connected to the first sub-line VL1 or the third sub-line VL3.

As used herein, "an electrode derived from an electrode line" may refer to an electrode formed by separating into parts an electrode line to which an alignment voltage was applied in order to align light-emitting diodes ED during the process of fabricating the display device 10. According to the foregoing description, the electrodes RME arranged in line with one another in the first direction DR1 may be derived from the same electrode line. The phrase "an electrode derived from a particular electrode line" may be defined to distinguish between electrode lines of the electrodes RME which may be disposed in different sub-pixels SPn or which may not be in line with one another in the first direction DR1.

The first electrode RME1 and the second electrode RME2 of the first sub-pixel SP1 may be derived from a pair of electrode lines, respectively. One of the electrode lines may be connected to the first sub-line VL1 while the other one of the electrode lines may be connected to the second sub-line VL2. The first electrode RME1 and the second electrode RME2 disposed in each of the sub-pixels SPn arranged in the first direction DR1 in line with the first sub-pixel SP1 may be derived from the electrode line connected to the first sub-line VL1 and the electrode line connected to the second sub-line VL2, respectively, like the first sub-pixel SP1.

On the other hand, the first electrode RME1 and the second electrode RME2 of the second sub-pixel SP2 may be derived from a pair of electrode lines, respectively, and one of the electrode lines may be connected to the third sub-line VL3 while the other one of the electrode lines may be connected to the second sub-line VL2. The first electrode RME1 and the second electrode RME2 disposed in each of the sub-pixels SPn arranged in the first direction DR1 in line with the second sub-pixel SP2 may be derived from the electrode line connected to the second sub-line VL2 and the electrode line connected to the third sub-line VL3, respectively, like the second sub-pixel SP2.

Based on this, the electrodes RMEs disposed in the sub-pixels SPn disposed at the uppermost and lowermost positions of the display area DPA in the first direction DR1, respectively, may be spaced apart from the conductive patterns EP extended to the different sub-lines VL1, VL2 and VL3. The first electrode RME1 and the second electrode RME2 of the first sub-pixel SP1 may be spaced apart from the conductive patterns EP extended to the first sub-line VL1 and the second sub-line VL2, respectively, in the first direction DR1. The first electrode RME1 and the second electrode RME2 of the second sub-pixel SP2 may be spaced apart from the conductive patterns EP extended to the second sub-line VL2 and the third sub-line VL3, respectively, in the first direction DR1. Hereinafter, the arrangement between the conductive patterns EP and the electrodes RME of different sub-pixels SPn will be described in detail with reference to other drawings.

Figure 10:
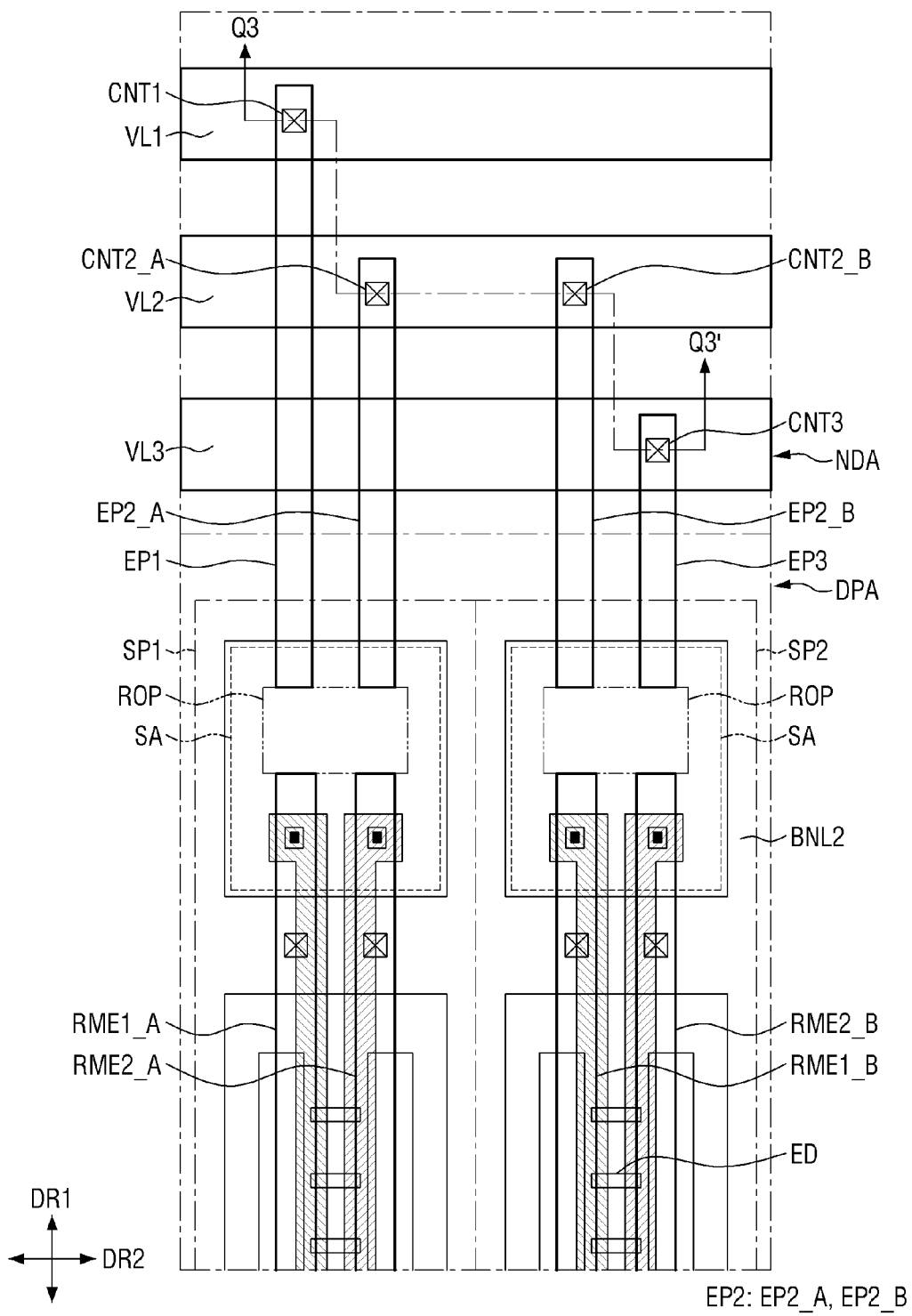
FIG. 10 is a schematic view showing the arrangement of lines and conductive patterns disposed in the non-display area and different sub-pixels in a display device according to an embodiment.
Figure 11:
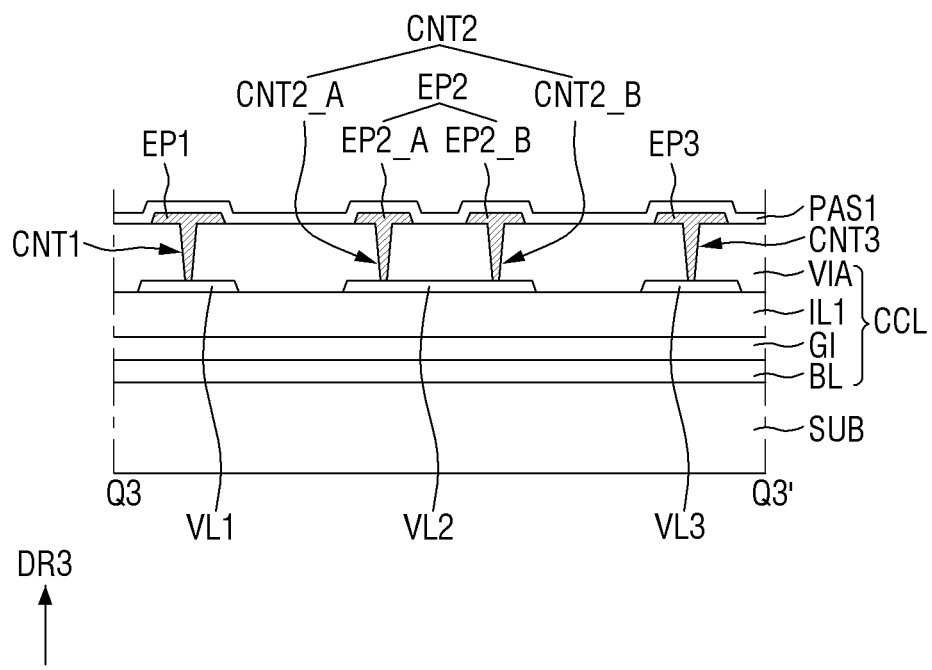
FIG. 11 is a schematic cross-sectional view taken along line Q3-Q3' of FIG. 10.

FIG. 10 is a schematic view showing the arrangement of lines and conductive patterns disposed in the non-display area and different sub-pixels in a display device according to an embodiment. FIG. 11 is a schematic cross-sectional view taken along line Q3-Q3' of FIG. 10. FIG. 10 shows a part of each of the first sub-pixel SP1 and the second sub-pixel SP2 at the outermost positions of the display area DPA in the first direction DR1, the conductive patterns EP; EP1, EP2 and EP3, and the sub-lines VL1, VL2 and VL3. FIG. 11 shows a cross-section along the portions where the conductive patterns EP1, EP2 and EP3 and the sub-lines VL1, VL2 and VL3 may be connected with one another.

Referring to FIGS. 10 and 11 in conjunction with FIGS. 3 and 9, the display device 10 according to an embodiment may include a first conductive pattern EP1, second conductive patterns EP2 and a third conductive pattern EP3 as multiple conductive patterns EP. The conductive patterns EP may be extended in the first direction DR1 from the subsidiary areas SA of the sub-pixels SPn; SP1 and SP2 disposed at the outermost positions (hereinafter referred to as outermost sub-pixels) of the display area DPA in the first direction DR1 to one of the sub-lines VL1, VL2 and VL3. For example, the first conductive pattern EP1 may be extended from the subsidiary area SA of the outermost sub-pixel SPn to the first sub-line VL1. The second conductive patterns EP2 may be extended from the subsidiary area SA of the outermost sub-pixel SPn to the second sub-line VL2, and the third conductive pattern EP3 may be extended from the subsidiary area SA of the outermost sub-pixel SPn to the third sub-line VL3. The first conductive pattern EP1 may be disposed across the first sub-line VL1, the second sub-line VL2, the third sub-line VL3 and the subsidiary area SA of the SUB-pixel SPn, the second conductive patterns EP2 may be disposed across the second sub-line VL2, the third sub-line VL3 and the subsidiary area SA of the sub-pixel SPn, and the third conductive pattern EP3 may be disposed across the third sub-line VL3 and the subsidiary area SA of the sub-pixel SPn.

Between the display area DPA and the pad area PDA, the third sub-line VL3, the second sub-line VL2 and the first sub-line VL1 may be sequentially disposed from the display area DPA, and accordingly the conductive patterns EP may have different lengths. According to an embodiment of the disclosure, the first conductive pattern EP1 may be longer in the first direction DR1 than the second conductive patterns EP2 and the third conductive pattern EP3, and the second conductive patterns EP2 may be longer than the third conductive pattern EP3. This may vary depending on the relative arrangement of the sub-lines VL1, VL2 and VL3 disposed in the non-display area NDA. The first conductive pattern EP1, the second conductive patterns EP2 and the third conductive pattern EP3 may be spaced apart from the respective electrodes RME of the outermost sub-pixels SPn in the first direction DR1 at the separation regions ROP formed in the subsidiary areas SA of the outermost sub-pixels SPn. The conductive patterns EP may be disposed in line with the electrodes RME spaced apart from them in the first direction DR1.

According to an embodiment of the disclosure, the electrodes RME and the conductive patterns EP may be disposed on the via layer VIA, and the sub-lines VL1, VL2 and VL3 may be formed as the third conductive layer at the bottom of the via layer VIA. The conductive patterns EP may be connected to the sub-lines VL1, VL2 and VL3 of the third conductive layer through contact holes CNT1, CNT2_A, CNT2_B and CNT3 passing through the via layer VIA, respectively. The first conductive pattern EP1 may be connected to the first sub-line VL1 through the first contact hole CNT1 penetrating through the via layer VIA and exposing a part of the first sub-line VL1, and the third conductive pattern EP3 may be connected to the third sub-line VL3 through the third contact hole CNT3 penetrating through the via layer VIA and exposing a part of the third sub-line VL3. The second conductive patterns EP2; EP2_A and EP2_B may be connected to the second sub-line VL2 through the second contact holes CNT2_A and CNT2_B penetrating through the via layer VIA and expose a part of the second sub-line VL2.

The sub-pixels SPn may be sorted into different sub-pixels SPn by the types of the conductive patterns EP in line with their electrodes RME in the first direction DR1. For example, a first electrode RME1_A of the first sub-pixel SP1 may be derived from the same electrode line as the first conductive pattern EP1, and the second electrode RME2_A of the first sub-pixel SP1 may be derived from the same electrode line as the second conductive pattern EP2_A. On the other hand, a first electrode RME1_B of the second sub-pixel SP2 may be derived from the same electrode line as the second conductive pattern EP2_B, and the second electrode RME2_B of the second sub-pixel SP2 may be derived from the same electrode line as the third conductive pattern EP3. The first sub-pixel SP1 and the second sub-pixel SP2 may be distinguished from each other depending on whether they include the electrode derived from the same electrode line with the first conductive pattern EP1 or the electrode derived from the same electrode line with the third conductive pattern EP3.

The first conductive pattern EP1 and the third conductive pattern EP3 may be derived from the electrode lines connected to the first sub-line VL1 and the third sub-line VL3, respectively, and the electrode lines may not be grounded but may receive alignment voltages having certain magnitudes. The first electrode RME1_A of the first sub-pixel SP1 may be derived from the electrode line to which an alignment voltage may be applied, while the second electrode RME2_B of the second sub-pixel SP2 may be derived from the electrode line to which an alignment voltage may be applied.

Each of the sub-pixels SPn may include an electrode derived from an electrode line that may be connected to the second sub-line VL2 and thus may be grounded, independently of the electrodes derived from the different electrode lines which may not be grounded. The second electrode RME2_A of the first sub-pixel SP1 may be derived from the grounded electrode line, and the first electrode RME1_B of the second sub-pixel SP2 may be derived from the grounded electrode line. In accordance with this, the second conductive patterns EP2 may be sorted into different conductive patterns depending on the positions of the electrodes RME spaced apart from them in the first direction DR1. The second conductive patterns EP2 may include a first-type conductive pattern EP2_A spaced apart from the second electrode RME2_A of the first sub-pixel SP1 in the first direction DR1, and a second-type conductive pattern EP2_B spaced apart from the first electrode RME1_B of the second sub-pixel SP2 in the first direction DR1. The first conductive pattern EP1 and the third conductive pattern EP3 may be spaced apart from each other in the second direction DR2. The first-type conductive pattern EP2_A and the second-type conductive pattern EP2_B may be disposed adjacent to each other in the second direction DR2.

The second electrode RME2_A of the first sub-pixel SP1 and the first electrode RME1_B of the second sub-pixel SP2 may be derived from the grounded electrode lines, respectively, while the first electrode RME1_B and the second electrode RME2_B may be derived from the electrode lines to which alignment voltages may be applied, respectively. Accordingly, the position of the electrode line to which an alignment voltage may be applied relative to the grounded electrode in the first sub-pixel SP1 may be different from that of the second sub-pixel SP2. According to an embodiment, alignment voltages having different polarities or opposite potentials may be applied to the first sub-line VL1 and the third sub-line VL3, respectively, in the display device 10. Even though the position of the first sub-line VL1 or the third sub-line VL3 relative to the grounded electrode line may be different in different sub-pixels SPn, the direction of the electric field generated by the alignment voltages may be the same. Accordingly, the orientation of the light-emitting diodes ED disposed in the sub-pixels SPn may also be the same. A way of applying alignment voltages through the sub-lines VL1, VL2 and VL3 and a way of aligning the light-emitting diodes during the process of fabricating the display device 10 will be described with reference to other drawings.

FIGS. 12 to 15 are schematic views showing multiple lines, electrodes and light-emitting diodes arranged in a process of fabricating a display device according to an embodiment.

Figure 12:
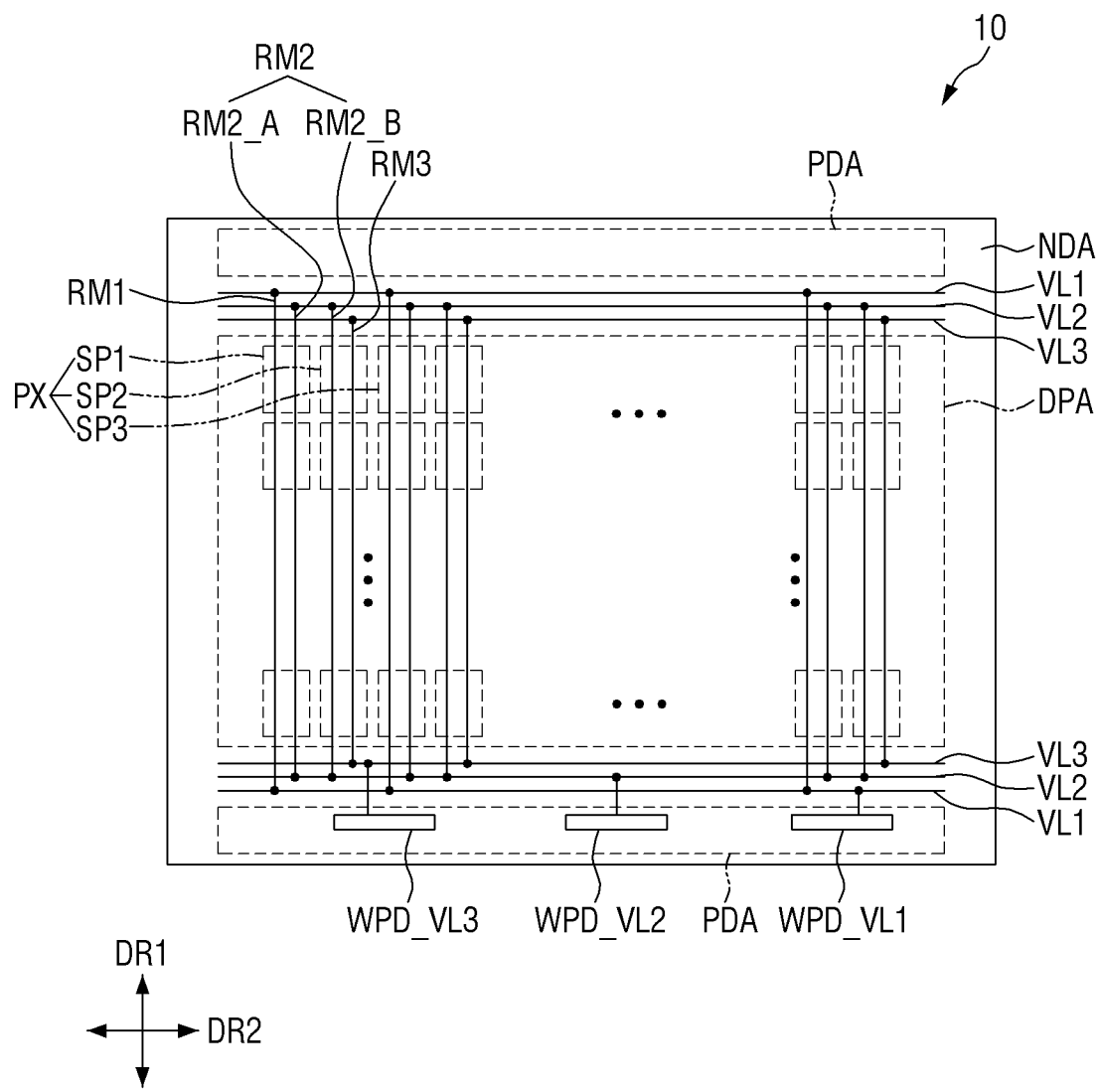
FIGS. 12 to 15 are schematic views showing multiple lines, electrodes and light-emitting diodes arranged in a process of fabricating a display device according to an embodiment.

Referring first to FIG. 12, a process of fabricating the display device 10 may include forming multiple electrode lines RM: RM1, RM2 and RM3 extended across the display area DPA and connected to multiple sub-lines VL1, VL2 and VL3, respectively. The electrode lines RM1, RM2 and RM3 may be disposed on a different layer from the sub-lines VL1, VL2 and VL3 and may be extended in the first direction DR1.

The first electrode line RM1 may be extended in the first direction DR1 and may be connected to the first sub-lines VL1 respectively disposed on the upper and lower sides of the display area DPA. The first electrode line RM1 may be connected to the first sub-line VL1 through the first contact hole CNT1 penetrating through the via layer VIA, and multiple first sub-lines VL1 may form an equipotential through multiple first electrode lines RM1. The first electrode line RM1 may be disposed in sub-pixels SPn arranged in the first direction DR1 in line with the first sub-pixel SP1 or the third sub-pixel SP3. Specifically, the first electrode line RM1 may be disposed in each of the odd-numbered sub-pixels SPn, where m may be an integer satisfying 2k−1 (k=1, 2, 3, . . . ), and each of the sub-pixels SPn in line with them in the first direction DR1.

Similarly, the third electrode line RM3 may be extended in the first direction DR1 and may be connected to the third sub-lines VL3 respectively disposed on the upper and lower sides of the display area DPA. The third electrode lines RM3 may be connected to the third sub-line VL3 through the third contact hole CNT3 penetrating through the via layer VIA, and multiple third sub-lines VL3 may form an equipotential through multiple third electrode lines RM3. The third electrode line RM3 may be disposed in the sub-pixels SPn arranged in the first direction DR1 in line with the second sub-pixel SP2. Specifically, the third electrode line RM3 may be disposed in each of the even-numbered sub-pixels SP1, where 1 may be an integer satisfying 2k (k=1, 2, 3, . . . ), and each of the sub-pixels SPn in line with them in the first direction DR1.

The second electrode lines RM2 may be extended in the first direction DR1 and may be connected to the second sub-lines VL2 respectively disposed on the upper and lower sides of the display area DPA. The second electrode lines RM2 may be connected to the second sub-lines VL2 through the second contact holes CNT2 penetrating through the via layer VIA, and the second sub-lines VL2 may form an equipotential through the second electrode lines RM2. The second electrode lines RM2 may include a first-type electrode line RM2_A disposed in the same sub-pixel with the first electrode line RM1, e.g., an odd-numbered sub-pixel SPn, and a second-type electrode line RM2_B disposed in the same sub-pixel with the third electrode line RM3, e.g., an even-numbered sub-pixel SP1.

According to an embodiment of the disclosure, the first electrode line RM1 may be spaced apart from and adjacent to the first-type electrode line RM2_A in the second direction DR2, the first-type electrode line RM2_A and the second-type electrode line RM2_B may be adjacent to each other, and the third electrode line RM3 may be spaced apart from and adjacent to the second-type electrode line RM2_B in the second direction DR2. The first electrode line RM1 and the first-type electrode line RM2_A may be disposed in the same sub-pixel SPn to form a pair of electrode lines, and the second-type electrode line RM2_B and the third electrode line RM3 may be disposed in the same sub-pixel SPn to form a pair of electrode lines.

Figure 13:
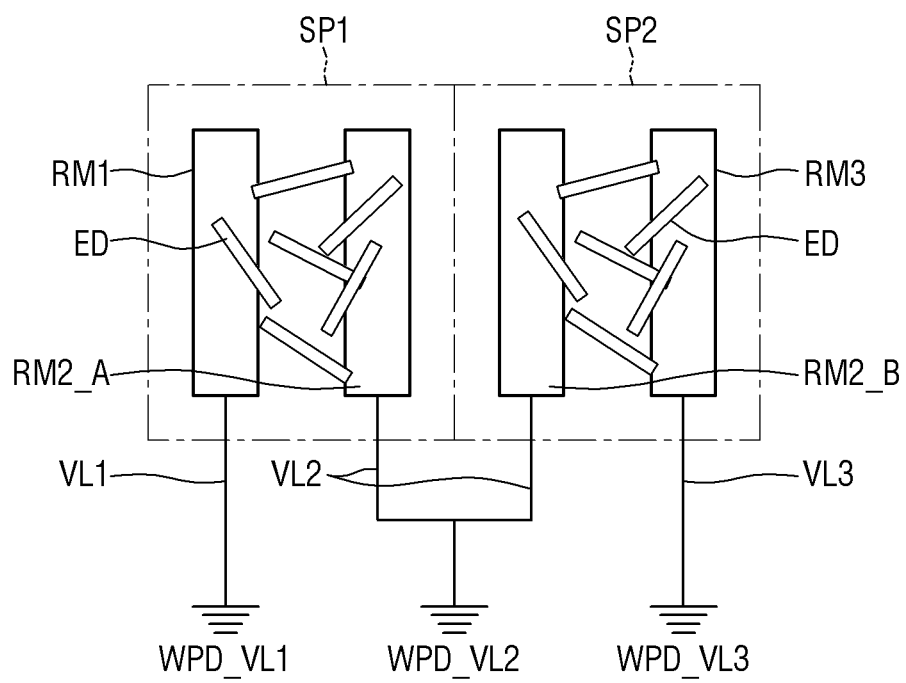

Subsequently, referring to FIG. 13, light-emitting diodes ED may be ejected onto each of the sub-pixels SPn; SP1 and SP2. According to an embodiment of the disclosure, an ink may be prepared, in which the light-emitting diodes ED may be dispersed, and the ink may be ejected onto each of the sub-pixels PXn via an inkjet printing process.

The light-emitting diodes ED ejected onto the first sub-pixel SP1 may be randomly located on the first electrode line RM1 and the first-type electrode line RM2_A. The light-emitting diodes ED ejected onto the second sub-pixel SP2 may be randomly located on the second-type electrode line RM2_B and the third electrode RM3. The first electrode line RM1 may be connected to the first wire pad WPD_VL1 through the first sub-line VL1, the first-type electrode line RM2_A and the second-type electrode line RM2_B may be connected to the second wire pad WPD_VL2 through the second line VL2, and the third electrode line RM3 may be connected to the third wire pad WPD_VL3 through the third line VL3.

Figure 14:
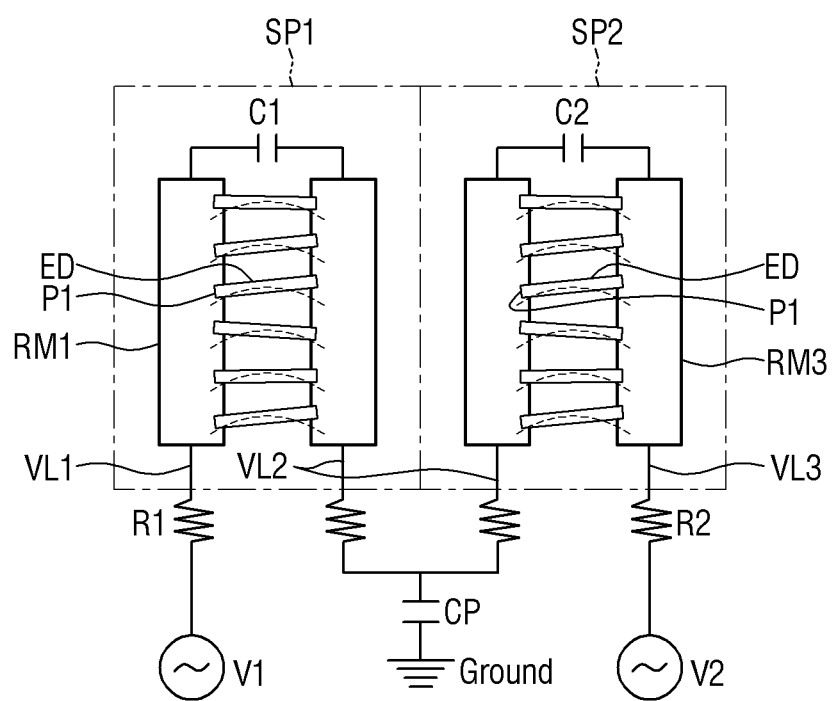

Subsequently, referring to FIG. 14, multiple of wire pads WPD_VL1, WPD_VL2 and WPD_VL3 may be connected to an external device, and alignment voltages may be applied to the sub-lines VL1, VL2 and VL3 and the electrode lines RM1, RM2 and RM3 through the wire pads WPD_VL1, WPD_VL2 and WPD_VL3. The first wire pad WPD_VL1 and the third wire pad WPD_VL3 may be in contact with signal application pads of the external device to receive alignment voltages V1 and V2, respectively. In case that the first wire pad WPD_VL1 may be in contact with a signal application pad, a first contact resistance R1 may be formed and a first alignment voltage V1 may be applied. In case that the third wire pad WPD_VL3 is in contact with a signal application pad, a second contact resistance R2 may be formed and a second alignment voltage V2 may be applied. The second wire pad WPD_VL2 may be connected to the signal application pad to be grounded.

According to an embodiment, during the process of fabricating the display device 10, the second wire pad WPD_VL2 and an external device may not be in direct contact with each other but may be electrically connected with each other by a capacitor CP for grounding. The second wire pad WPD_VL2 and a signal application pad of the external device may form the capacitor CP with a dielectric therebetween, and may be grounded with a potential through the capacitor CP. Unlike the first electrode line RM1 and the third electrode line RM3, the second electrode lines RM2 form an electric field in the grounded state, and thus it may be necessary to maintain the potential. In order to prevent the magnitude of the voltage from being lowered due to the contact resistance between the second wire pad WPD_VL2 and the signal application pad of the external device by way of reducing the contact resistance, the second wire pad WPD_VL2 may not be in direct contact with the signal application pad but may be grounded.

In case that the second electrode lines RM2 are grounded and the alignment voltages V1 and V2 are applied to the first electrode line RM1 and the third electrode line RM3, respectively, electric fields C1 and C2 may be generated by potential differences between the first electrode line RM1 and the first-type electrode line RM2_A and between the second-type electrode line RM2_B and the third electrode line RM3. Since the first electrode line RM1 and the third electrode line RM3 may be disposed on the left and right sides of the grounded second electrode line RM2, respectively, the directions in which the first electric field C1 and the second electric field C2 may be directed may be different depending on the polarities of the alignment voltages V1 and V2. According to an embodiment of the disclosure, the alignment voltages V1 and V2 applied to the first electrode line RM1 and the third electrode line RM3, respectively, may have the opposite polarities or opposite potentials at the same timing. As the first alignment voltage V1 and the second alignment voltage V2 have the opposite polarities, even if the contact resistances R1 and R2 between the first wire pad WPD_VL1 and the signal application pad and between the third wire pad WPD_VL3 and the signal application pad increases, the resulting voltage drop may be relatively small compared to the voltage drop in case that a single alignment voltage is applied.

In some embodiments, the first alignment voltage V1 and the second alignment voltage V2 may be AC voltages. The alignment voltages V1 and V2 applied in the form of AC voltages may have the opposite polarities at the same timing, and the voltage drop due to the contact resistances R1 and R2 can be reduced. It is, however, to be understood that the disclosure is not limited thereto. The alignment voltages V1 and V2 may be voltages having a waveform other than an AC voltage.

As the first alignment voltage V1 and the second alignment voltage V2 may have the opposite polarities, if the sub-pixels SPn have the same structure of the electrode or electrode line, the generated electric fields C1 and C2 may have different directions. In this regard, in the display device 10 according to an embodiment of the disclosure, the positions of the electrode lines RM1 and RM3 to which the alignment voltages V1 and V2 may be applied, respectively, relative to the grounded second electrode line RM2 may be different between the first sub-pixel SP1 and the second sub-pixel SP2, or between the odd-numbered sub-pixels SPn and the even-numbered sub-pixels SPn. The first electrode line RM1 may be disposed on the left side of the center of the first sub-pixel SP1 while the second electrode line RM2 may be disposed on the right side of the center, while the second electrode line RM2 may be disposed on the left side of the center of the second sub-pixel SP2 and the third electrode line RM3 may be disposed on the right side of the center. Accordingly, even though the alignment voltages V1 and V2 applied to the first electrode line RM1 and the third electrode line RM3, respectively, may have the opposite polarities, the electric fields C1 and C2 generated in the sub-pixels may have the same direction, and the direction in which the first ends P1 of the light-emitting diodes ED may face in the same direction. As shown in the drawings, the light-emitting diodes ED may be oriented such that their first ends P1 face the left side. It is, however, to be understood that the disclosure is not limited thereto. The orientation of the light-emitting diodes ED may vary depending on the positions of the first electrode line RM1 and the third electrode line RM3.

Figure 15:
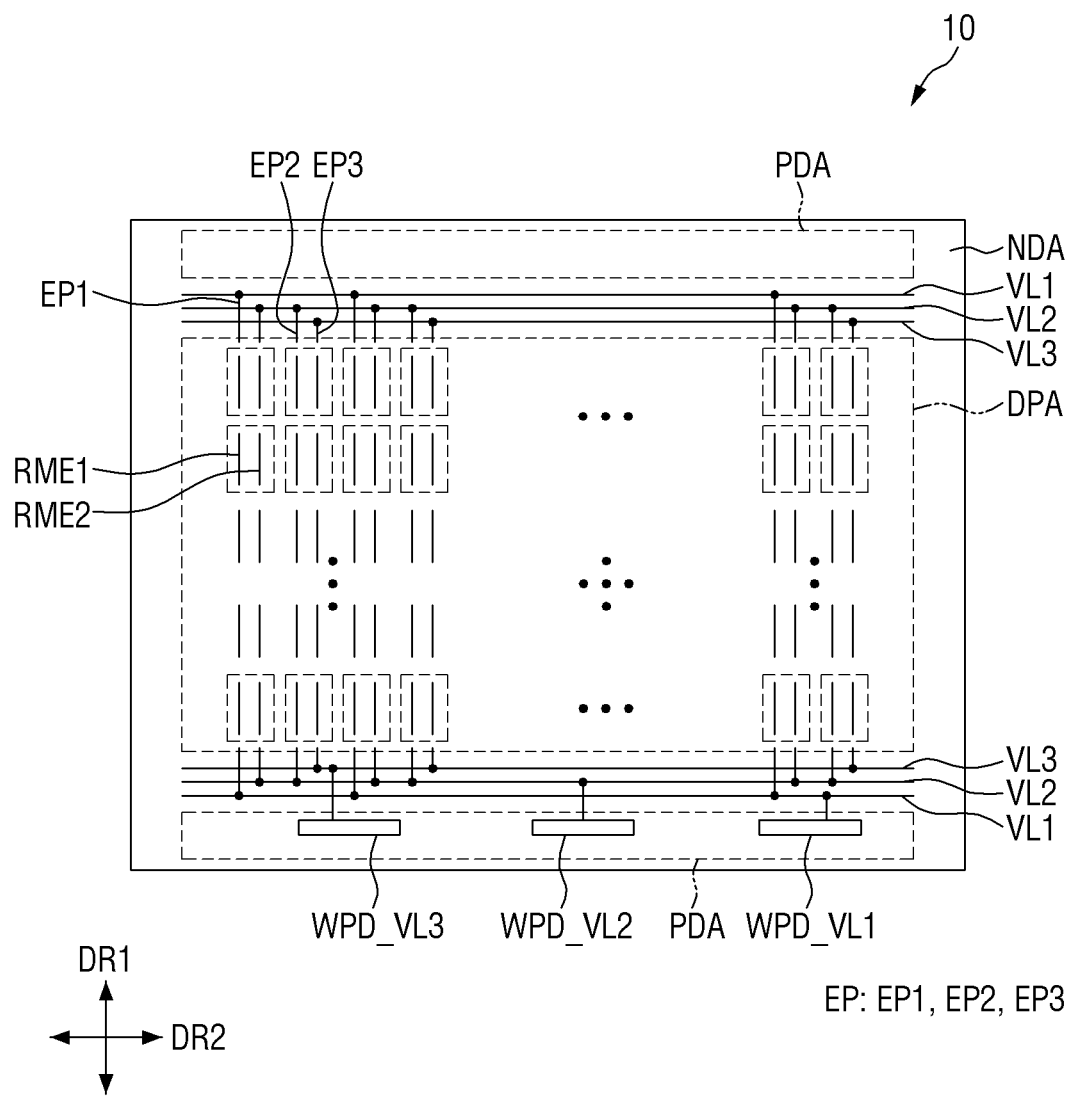

Subsequently, referring to FIG. 15, after the light-emitting diodes ED have been arranged, a second insulating layer PAS2 may be formed to fix them, and each of the electrode lines RM1, RM2 and RM3 may be separated into parts. By doing so, multiple electrodes RME1 and RME2 and multiple conductive patterns EP1, EP2 and EP3 may be formed. The first electrode line RM1 may be separated into parts at the separation region ROP formed in the subsidiary area SA of each of the sub-pixels SPn, to form the first electrode RME1 of each of the odd-numbered sub-pixels SPn, and the first conductive pattern EP1. The third electrode line RM3 may be separated into parts at the separation region ROP to form the second electrode RME2 of each of the even-numbered sub-pixels SPn and the third conductive pattern EP3.

The first-type electrode line RM2_A of the second electrode line RM2 may be separated into parts at the separation region ROP to form the second electrode RME2 of each of the odd-numbered sub-pixels SPn and the first-type conductive pattern EP2_A. The second-type electrode line RM2_B of the second electrode line RM2 may be separated into parts at the separation region ROP to form the first electrode RME1 of each of the even-numbered sub-pixels SPn and the second-type conductive pattern EP2_B. The conductive patterns EP may be residues remaining after the electrode lines RM1, RM2 and RM3 from which the electrodes RME may be derived have been separated into parts, and it may be possible to check the connection structure between the electrodes RME and the sub-lines VL1, VL2 and VL3 based on them.

Subsequently, although not shown in the drawings, connection electrodes CNE and a third insulating layer PAS3 may be formed in each of the sub-pixels SPn, thereby fabricating the display device 10.

The display device 10 according to an embodiment of the disclosure may include a first sub-line VL1 and a third sub-line VL3 to which alignment voltages V1 and V2 may be applied, respectively, and may include a grounded line as a second wiring VL2. The display device 10 may include multiple conductive patterns EP1, EP2 and EP3 representing the connection structure between the electrode lines RM1, RM2 and RM3 and the sub-lines VL1, VL2 and VL3. According to the embodiment of the disclosure, as the alignment voltages V1 and V2 may be applied to multiple lines, it may be possible to reduce a voltage drop due to the contact resistance between the wire pads WPD_VL1, WPD_VL2 and WPD_VL3 and the signal application pads. As the voltage drop of the alignment voltages V1 and V2 may be reduced, the electric fields C1 and C2 generated in each of the sub-pixels SPn can have sufficient magnitude, and thus the alignment of the light-emitting diodes ED can be improved.

Hereinafter, display devices according to a variety of embodiments of the disclosure will be described with reference to other drawings.

Figure 16:
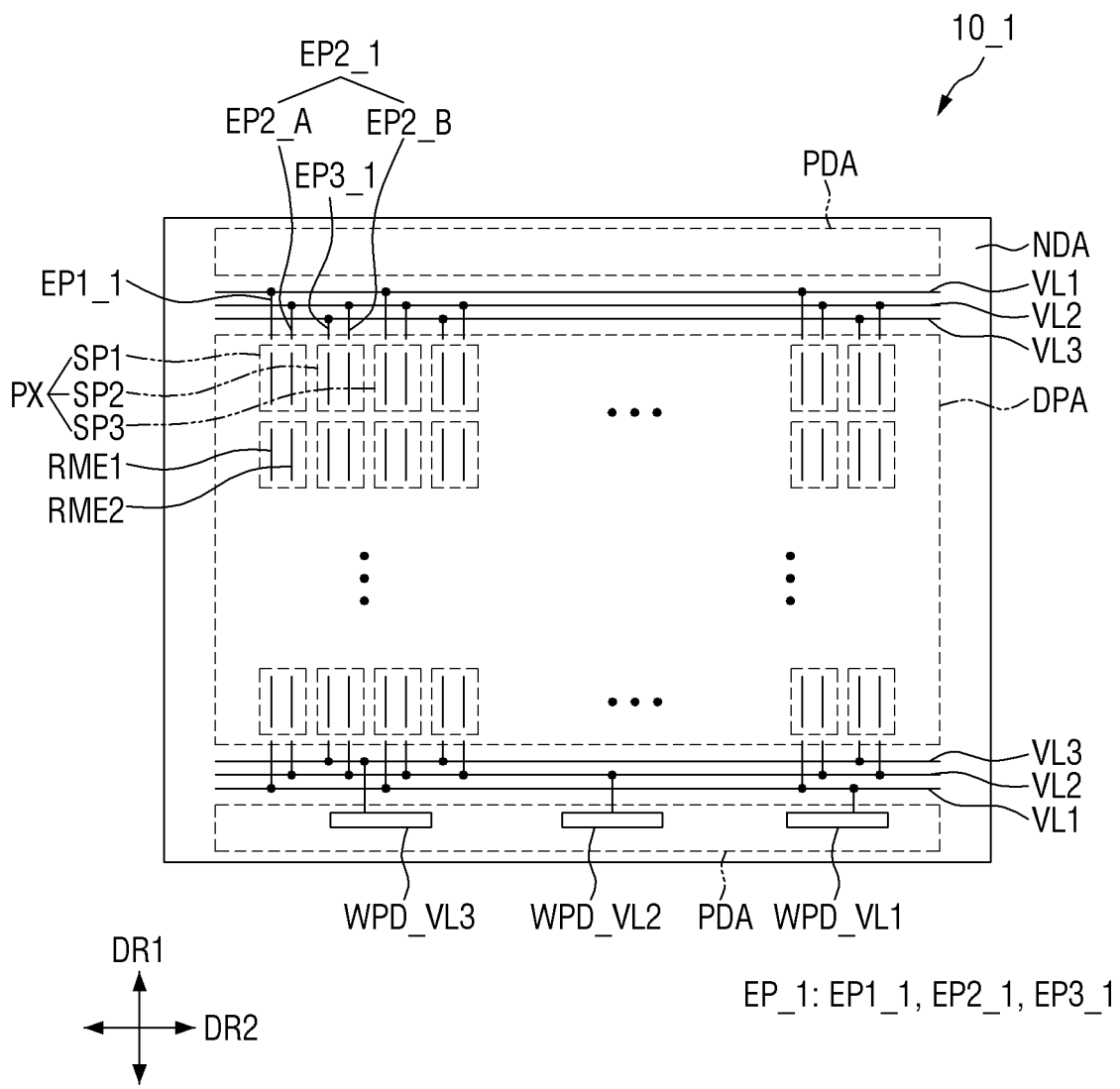
FIG. 16 is a schematic view showing arrangement of lines of a display device and electrodes disposed in sub-pixels according to another embodiment of the disclosure.
Figure 17:
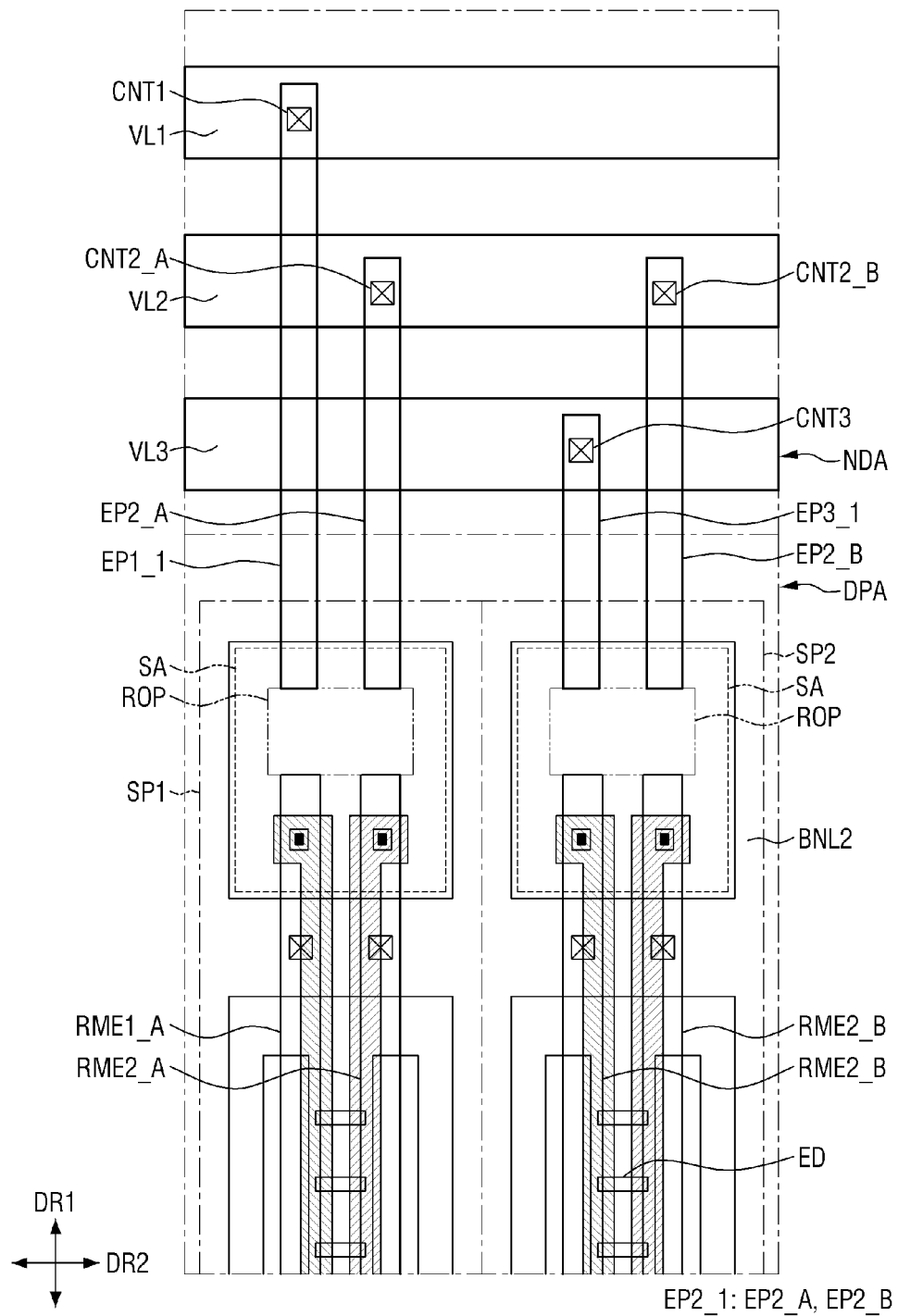
FIG. 17 is a schematic view showing the arrangement of lines and conductive patterns disposed in the non-display area and different sub-pixels in the display device of FIG. 16.

FIG. 16 is a schematic view showing arrangement of lines of a display device and electrodes disposed in sub-pixels according to another embodiment of the disclosure. FIG. 17 is a schematic view showing the arrangement of lines and conductive patterns disposed in the non-display area and different sub-pixels in the display device of FIG. 16.

Referring to FIGS. 16 and 17, a display device 10_1 according to an embodiment may have different arrangement of conductive patterns EP1_1, EP2_1 and EP3_1, especially the conductive patterns EP in line with the electrodes RME in the first direction DR1 in the second sub-pixel SP2 or even-numbered sub-pixels SPn. According to this embodiment, the arrangement of a second-type conductive pattern EP2_B and a third conductive pattern EP3_1 in line with the electrodes RME of the even-numbered sub-pixels SPn in the first direction DR1 may be different from that of FIG. 9.

A first conductive pattern EP1_1 and a first-type conductive pattern EP2_A of a second conductive pattern EP2_1 may be disposed in line with a first electrode RME1_A and a second electrode RME2_A of the first sub-pixel SP1 or odd-numbered sub-pixel SPn, respectively, in the first direction DR1. The description thereon has already been given above.

A second-type conductive pattern EP2_B of a second conductive pattern EP2_1 and a third conductive pattern EP3_1 may be disposed in line with a first electrode RME1_B and a second electrode RME2_B of the second sub-pixel SP2 or even-numbered sub-pixel SP1, respectively, in the first direction DR1. The third conductive pattern EP3_1 may be disposed between the first-type conductive pattern EP2_A and the second-type conductive pattern EP2_B. In the second sub-pixel SP2 and the even-numbered sub-pixels SP1, the first electrode RME1_B may be derived from the third electrode line RM3 to which the second alignment voltage V2 may be applied, while the second electrode RME2_B may be derived from the second-type electrode line RM2_B that may be grounded. The first conductive pattern EP1_1 and the third conductive pattern EP3_1 may be spaced apart from each other in the second direction DR2, and the first-type conductive pattern EP2_A may be disposed between them. The second-type conductive pattern EP2_B may be disposed to be spaced apart from the first-type conductive pattern EP2_A in the second direction DR2 with the third conductive pattern EP3_1 interposed therebetween.

The conductive patterns EP may be differently arranged because the positions of the third electrode line RM3 and the second-type electrode line RM2_B have changed during the process of fabricating the display device 10_1.

Figure 18:
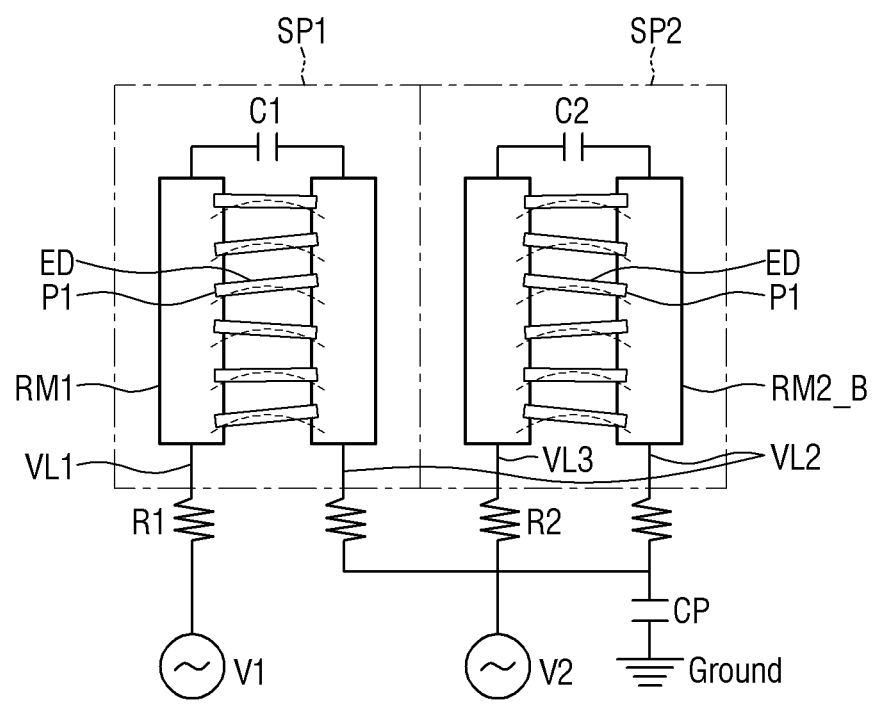
FIG. 18 is a schematic view showing an alignment step of light-emitting diodes during the process of fabricating the display device of FIG. 16.
Figure 19:
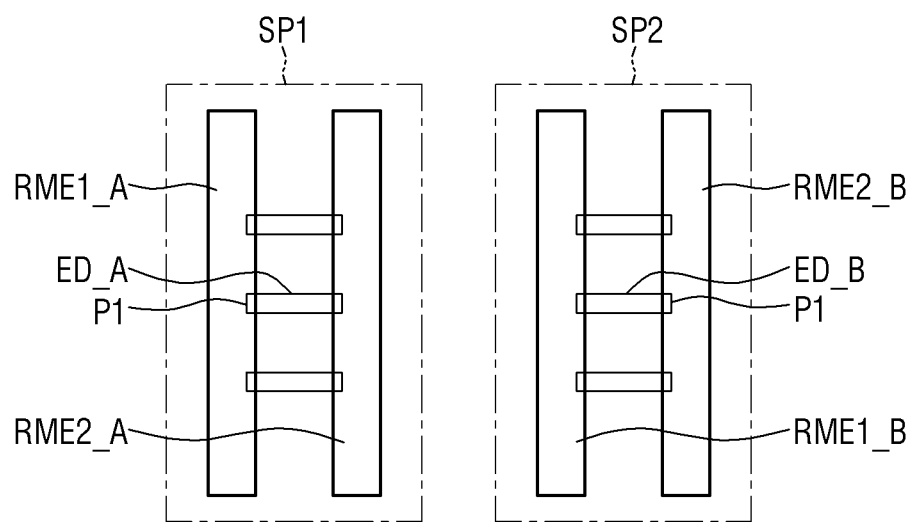
FIG. 19 is a schematic view showing an arrangement of light-emitting diodes disposed on different sub-pixels in the display device of FIG. 16.

FIG. 18 is a schematic view showing an alignment step of light-emitting diodes during the process of fabricating the display device of FIG. 16. FIG. 19 is a schematic view showing arrangement of light-emitting diodes disposed on different sub-pixels in the display device of FIG. 16.

Referring to FIGS. 18 and 19 in conjunction with FIGS. 16 and 17, in the second sub-pixel SP2 and the even-numbered sub-pixels SPn, the third electrode line RM3 to which the second alignment voltage V2 may be applied may be disposed on the left side of the sub-pixel, while the grounded second-type electrode line RM2_B may be disposed on the right side. Accordingly, the grounded electrode line, i.e., the second electrode lines RM2 may be disposed on the same side in the first sub-pixel SP1 and the second sub-pixel SP2, or in the odd-numbered sub-pixels SPn and the even-numbered sub-pixels SP1. Accordingly, the first conductive pattern EP1_1 and the third conductive pattern EP3_1 may be disposed in line with the first electrode RME1_A and RME1_B, respectively, in the first direction DR1. The second conductive pattern EP2_1; EP2_A and EP2_B may be disposed in line with the second electrodes RME2_A and RME2_B, respectively, in the first direction DR1.

It is, however, to be noted that the direction of the second electric field C2 generated in the second sub-pixel SP2 may be changed because the position of the third electrode line RM3 to which the second alignment voltage V2 may be applied may be different from that of the embodiment of FIG. 9. According to an embodiment, in addition to the different arrangement of the conductive patterns EP_1, the display device 10_1 may include sub-pixels SP1 and SP2 having the first ends P1 facing in different directions. While the first ends P1 of the light-emitting diodes ED_A of the first sub-pixel SP1 and the odd-numbered sub-pixel SPn face the left side, the first ends P1 of the light-emitting diodes ED_B of the second sub-pixel SP2 and the even-numbered sub-pixel SP1 may face the right side. Accordingly, in the second sub-pixel SP2 and the even-numbered sub-pixels SPn, the first electrode RME1_B may be electrically connected to the second voltage line VSL, and the second electrode RME2_B may be electrically connected to the first transistor T1.

The arrangement of the electrodes RME of the sub-pixels SPn, and the electrode lines RM may be modified in a variety of ways as long as the display device 10_1 includes the first sub-line VL1 and the third sub-line VL3 to which the alignment voltages V1 and V2 may be applied, respectively. In the display device 10_1, the arrangement of the electrodes RME or the electrode lines RM in some sub-pixels, e.g., the second sub-pixel SP2 or the even-numbered sub-pixels SPn relative to the first sub-pixel SP1 or the odd-numbered sub-pixel SPn may be different from that of the embodiment of FIG. 9. Accordingly, the orientations of the light-emitting diodes ED_A and ED_B of the display device 10_1 may be different depending on the type of the sub-pixels SPn, and the connection of the electrodes RME of the sub-pixels SPn may also vary accordingly.

Figure 20:
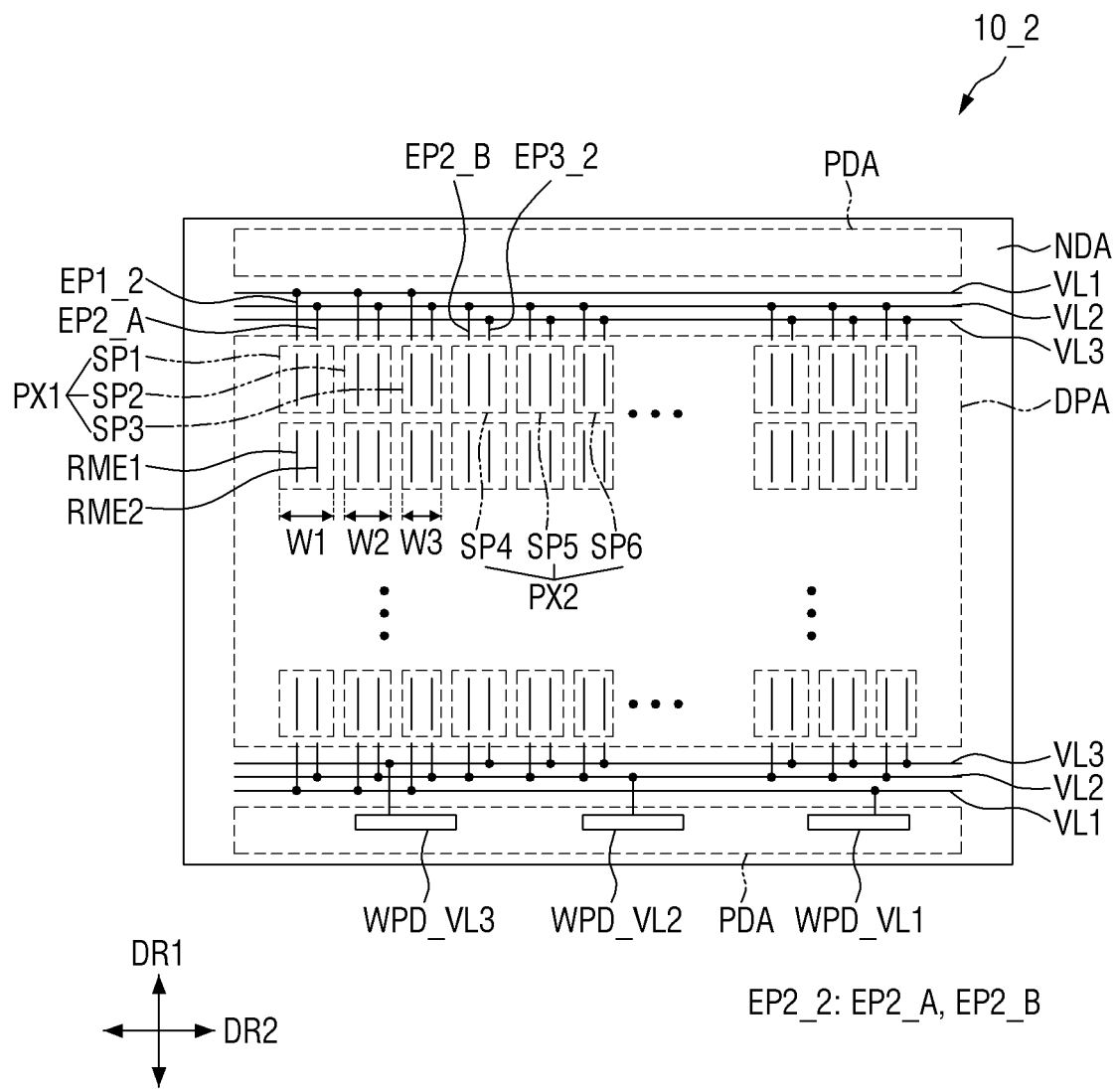
FIG. 20 is a schematic view showing arrangement of lines of a display device and electrodes disposed in sub-pixels according to another embodiment of the disclosure.
Figure 21:
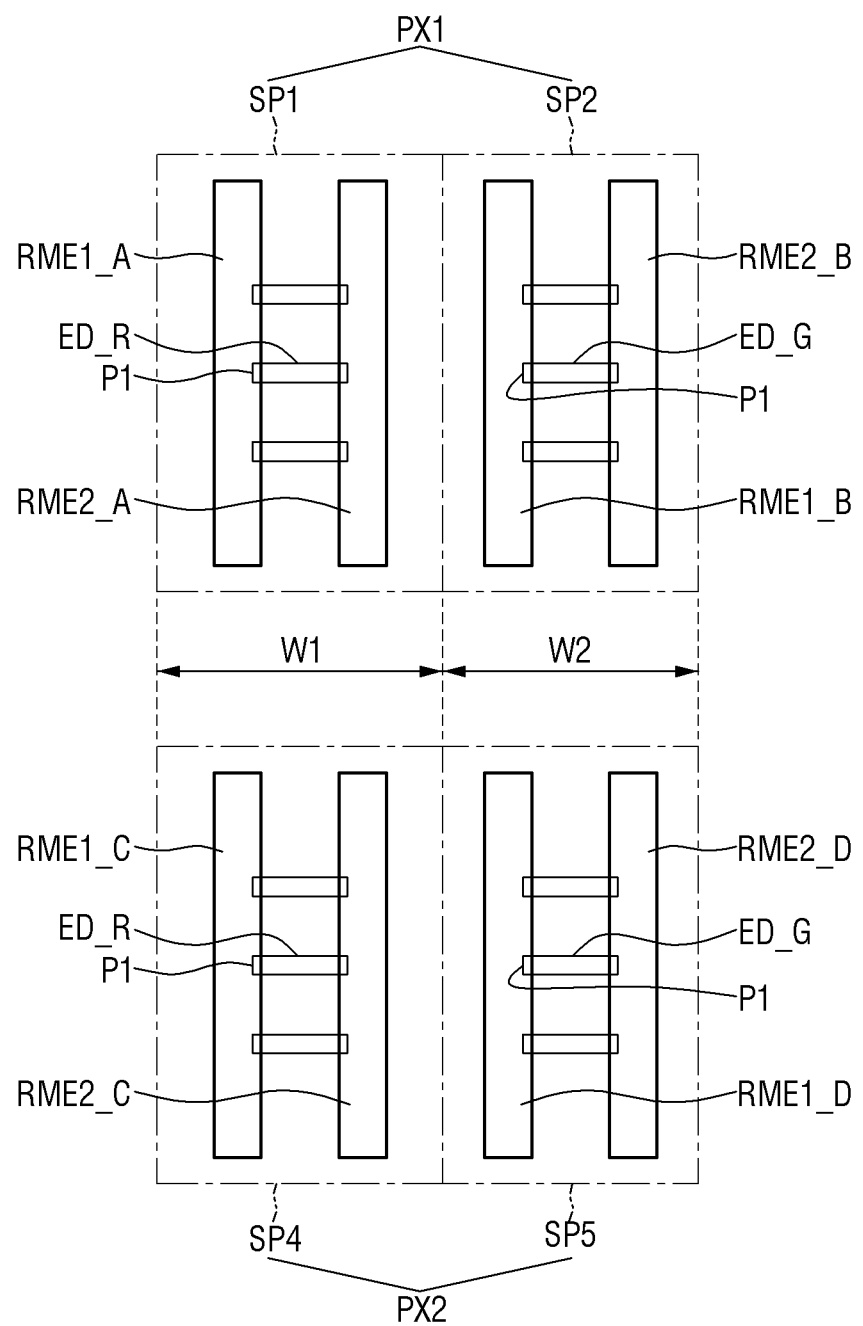
FIG. 21 is a schematic view showing arrangement of light-emitting diodes disposed on different sub-pixels in the display device of FIG. 20.

FIG. 20 is a schematic view showing arrangement of lines of a display device and electrodes disposed in sub-pixels according to another embodiment of the disclosure. FIG. 21 is a schematic view showing arrangement of light-emitting diodes disposed on different sub-pixels in the display device of FIG. 20.

Referring to FIGS. 20 and 21, in a display device 10_2 according to an embodiment, multiple sub-pixels SPn; SP1, SP2 and SP3 included in a single pixel PX may have different areas. As described above, the sub-pixels SPn included in a single pixel PX may emit light of the same color, but the disclosure is not limited thereto. The sub-pixels SPn may emit light of different colors. For example, the first sub-pixel SP1, the second sub-pixel SP2 and the third sub-pixel SP3 included in the first pixel PX1 may emit red, green, and blue light, respectively. Similarly, the fourth sub-pixel SP4, the fifth sub-pixel SP5 and the sixth sub-pixel SP6 included in the second pixel PX2 may emit red, green, and blue light, respectively.

In an embodiment where the sub-pixels SPn emit light of different colors, the sub-pixels SPn may have different areas. According to an embodiment of the disclosure, the areas of the first and fourth sub-pixels SP1 and SP4 may be larger than the areas of the second and the fifth sub-pixels SP2 and SP5, and the third and the sixth sub-pixels SP3 and SP6. The areas of the second sub-pixel SP2 and the fifth sub-pixel SP5 may be larger than the areas of the third sub-pixel SP3 and the sixth sub-pixel SP6. Comparing the relative areas of the sub-pixels SPn with one another based on the widths measured in the second direction DR2, a first width W1 of the first sub-pixel SP1 and the fourth sub-pixel SP4 may be larger than a second width W2 of the second sub-pixel SP2 and the fifth sub-pixel SP5, and a third width W3 of the third sub-pixel SP3 and the sixth sub-pixel SP6. The second width W2 of the second sub-pixel SP2 and the fifth sub-pixel SP5 may be larger than the third width W3 of the third sub-pixel SP3 and the sixth sub-pixel SP6.

The sub-pixels SPn may emit light of different colors depending on the type of the light-emitting diodes ED disposed therein, and thus may have different areas. For example, first light-emitting diodes ED_R that emits red light may be disposed in the first sub-pixel SP1 and the fourth sub-pixel SP4, and second light-emitting diodes ED_G that emits green light may be disposed in the second sub-pixel SP2 and the fifth sub-pixel SP5. Although not shown in the drawings, third light-emitting diodes emitting blue light may be disposed in the third sub-pixel SP3 and the sixth sub-pixel SP6.

In an embodiment where a single pixel PX includes multiple sub-pixels SPn having different areas, the sub-pixel SPn to which the first alignment voltage V1 may be applied and the sub-pixels SPn to which the second alignment voltage V2 may be applied may have the same area. For example, if the first sub-pixel SP1 having the first width W1 includes the first electrode RME1 derived from the first electrode line RM1 and may be disposed in line with the first conductive pattern EP1_2, the fourth sub-pixel SP4 having the first width W1 may include the second electrode RME2 derived from the third electrode line RM3 and may be disposed in line with the third conductive pattern EP3_2. If the second sub-pixel SP2 and the third sub-pixel SP3 belonging to the same first pixel PX1 with the first sub-pixel SP1 includes the first electrode RME1 derived from the first electrode line RM1 and may be disposed in line with the first conductive pattern EP1_2, the fifth sub-pixel SP5 and the sixth sub-pixel SP6 may include the second electrode RME2 derived from the third electrode line RM3 and may be disposed in line with the third conductive pattern EP3_2.

That is to say, in the display device 10_2 according to an embodiment, the sub-pixel SPn including the electrode RME in line with the first conductive pattern EP1_2 in the first direction DR1 may have the same area with the sub-pixel SPn including the electrodes RME in line with the third conductive pattern EP3_2 in the first direction DR1. For example, the first sub-pixel SP1 and the fourth sub-pixel SP4 include the electrode in line with the first conductive pattern EP1_2 and the electrode in line with the third conductive pattern EP3_2, respectively, and include the electrodes derived from the electrode line RM1 and the third electrode line RM3, respectively. The first alignment voltage V1 and the second alignment voltage V2 may be applied to the first sub-pixel SP1 and the fourth sub-pixel SP4, respectively, and the first electric field C1 and the second electric field C2 may be applied to them, respectively. Different electric fields C1 and C2 may be generated in each of the sub-pixels SPn depending on the position across the front surface of the display area DPA. If the area occupied by the sub-pixels SPn in which the first electric field C1 may be generated may be different from the area occupied by the sub-pixels SPn in which the second electric field C2 may be generated, there may be a difference in the intensity of the electric field per area, and thus the light-emitting diodes ED may get out of alignment. In order to prevent this, in case that the sub-pixels SPn have different areas in the display device 10_2, the arrangement of the electrode lines RM may be designed so that the area of the sub-pixels SPn in which the electrode RME in line with the first conductive pattern EP1_2 may be disposed may be equal to the area of the sub-pixels SPn in which the electrode RME in line with the third conductive pattern EP3_2 may be disposed. Accordingly, the alignment of the light-emitting diodes ED can be improved, and there may be an advantage in that luminance according to the color of emitted light can be corrected based on the area of each of the sub-pixels SPn.

Incidentally, according to the embodiments of FIGS. 20 and 21, the sub-pixels SP1, SP2 and SP3 of the first pixel PX1 may include the first electrodes RME1_A and RME1_B in line with the first conductive pattern EP1_2, while the sub-pixels SP4, SP5 and SP6 of the second pixel PX2 may include the second electrodes RME2_C and RME2_D in line with the third conductive pattern EP3_2. The sub-pixels of the first pixel PX1 may include the second electrodes RME2_A and RME2_B derived from the grounded second electrode line RM2, while the sub-pixels of the second pixel PX2 may include the first electrodes RME1_C and RME1_D derived from the grounded second electrode line RM2. Accordingly, the light-emitting diodes ED disposed in the sub-pixels SPn may have the first end P1 facing in the same direction. It is, however, to be understood that the disclosure is not limited thereto. The light-emitting diodes ED disposed in the first pixel PX1 and the second pixel PX2 may face in different directions depending on the arrangement of the electrode lines of the second pixel PX2.

Figure 22:
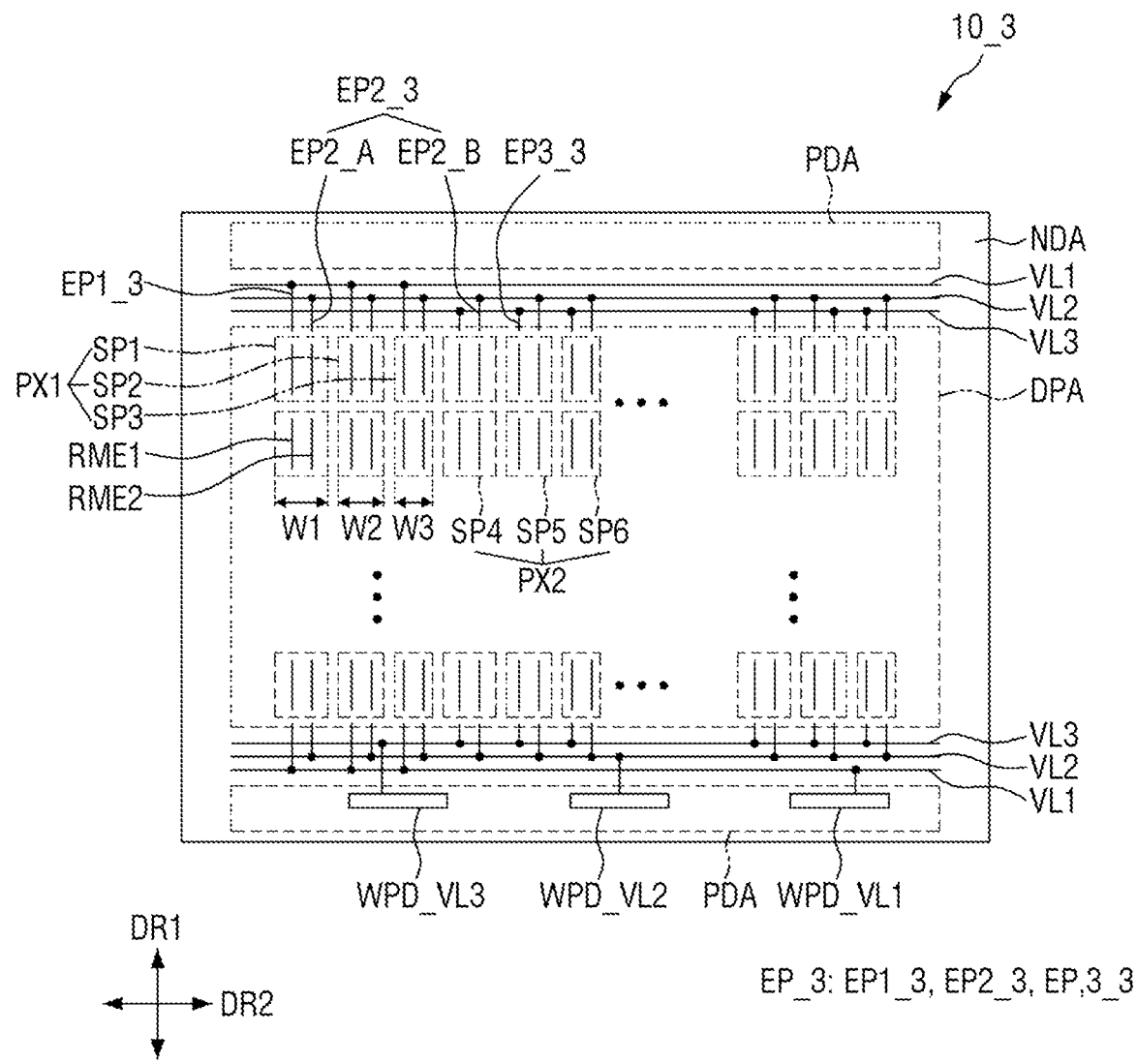
FIG. 22 is a schematic view showing arrangement of lines of a display device and electrodes disposed in sub-pixels according to another embodiment of the disclosure.
Figure 23:
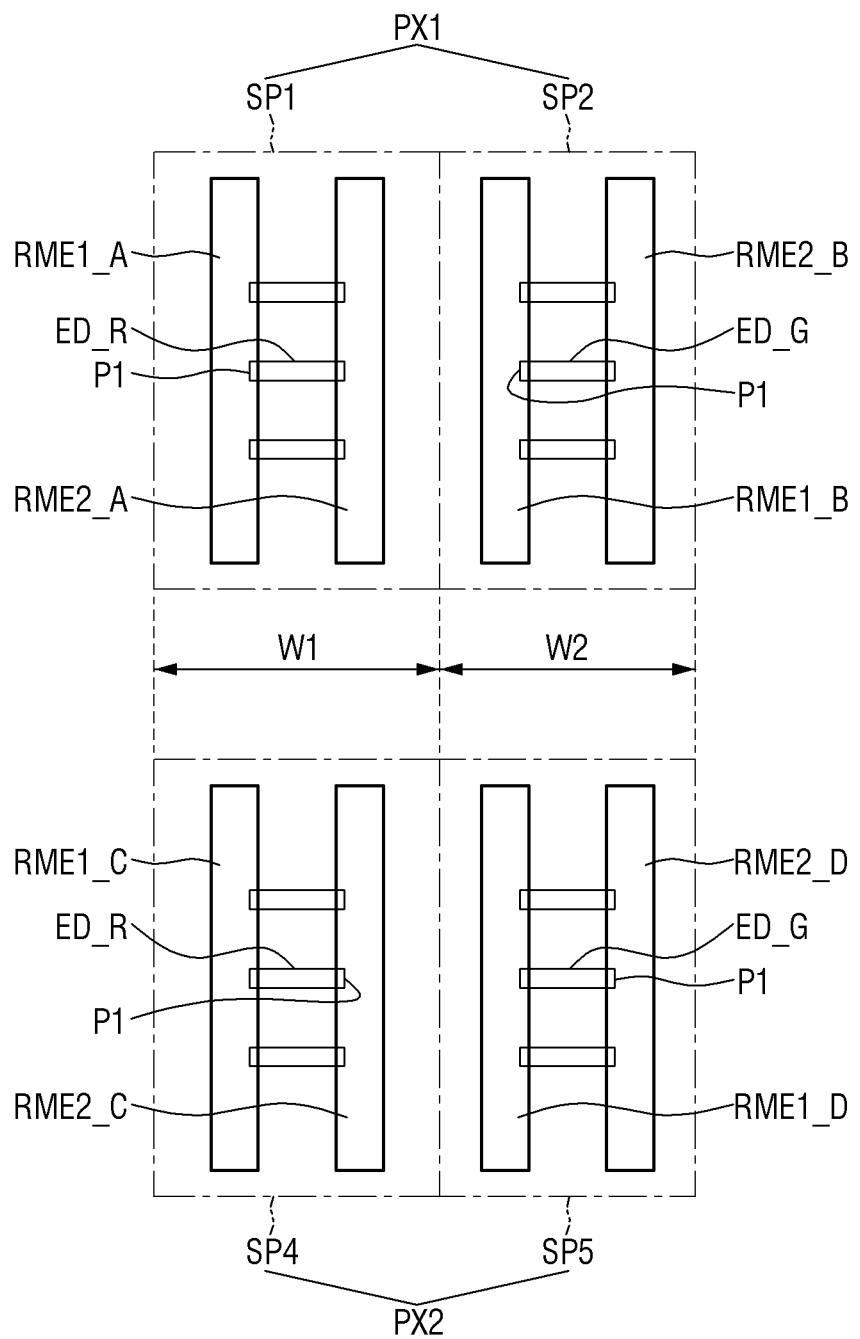
FIG. 23 is a schematic view showing arrangement of light-emitting diodes disposed on different sub-pixels in the display device of FIG. 22.

FIG. 22 is a schematic view showing arrangement of lines of a display device and electrodes disposed in sub-pixels according to another embodiment of the disclosure. FIG. 23 is a schematic view showing arrangement of light-emitting diodes disposed on different sub-pixels in the display device of FIG. 22.

Referring to FIGS. 22 and 23, in a display device 10_3 according to an embodiment, a single pixel PX may include multiple sub-pixels SPn having different areas, and the orientation of the light-emitting diode ED disposed in a first pixel PX1 may be different from the orientation of the light-emitting diode ED disposed in a second pixel PX2. The display device 10_3 according to this embodiment may be different from that of the embodiments of FIGS. 20 and 21 in that the light-emitting diodes ED may have different orientations. In the following description, descriptions will focus on the difference, and the redundant description will be omitted.

The arrangement and structure of the sub-pixels SPn; SP1, SP2 and SP3 of the first pixel PX1 may be the same as those of the embodiment of FIG. 20. On the other hand, the sub-pixels SPn; SP4, SP5 and SP6 of the second pixel PX2 may include first electrodes RME1_C and RME1_D in line with the third conductive pattern EP3_3 unlike the embodiment of FIGS. 20 and 21. The sub-pixels of the first pixel PX1 and the second pixel PX2 may include second electrodes RME2_A, RME2_B, RME2_C and RME2_D derived from the grounded second electrode line RM2. Accordingly, the first ends P1 of the light-emitting diodes ED in the sub-pixels SPn of the first pixel PX1 and the first ends P1 of the light-emitting diodes ED in the sub-pixels SPn of the second pixel PX2 may face in the opposite directions.

According to the embodiment of FIG. 20 and the embodiment of FIG. 22, the electrode line from which the first conductive pattern EP1_3 may be derived and the electrode line from which the first-type conductive pattern EP2_A may be derived may be arranged alternately in the first pixel PX1 and the pixels in line with it in the first direction DR1, and the electrode line from which the third conductive pattern EP3_3 may be derived and the electrode line from which the second-type conductive pattern EP2_B may be derived may be arranged alternately in the first pixel PX1 and the pixels in line with it in the first direction DR1. That is to say, one first-type conductive pattern EP2_A may be disposed between the first conductive patterns EP2_3 adjacent to each other in the second direction DR2, and one second-type conductive pattern EP2_B may be disposed between the third conductive pattern EP3_3 adjacent to each other in the second direction DR2. It is, however, to be understood that the disclosure is not limited thereto.

Figure 24:
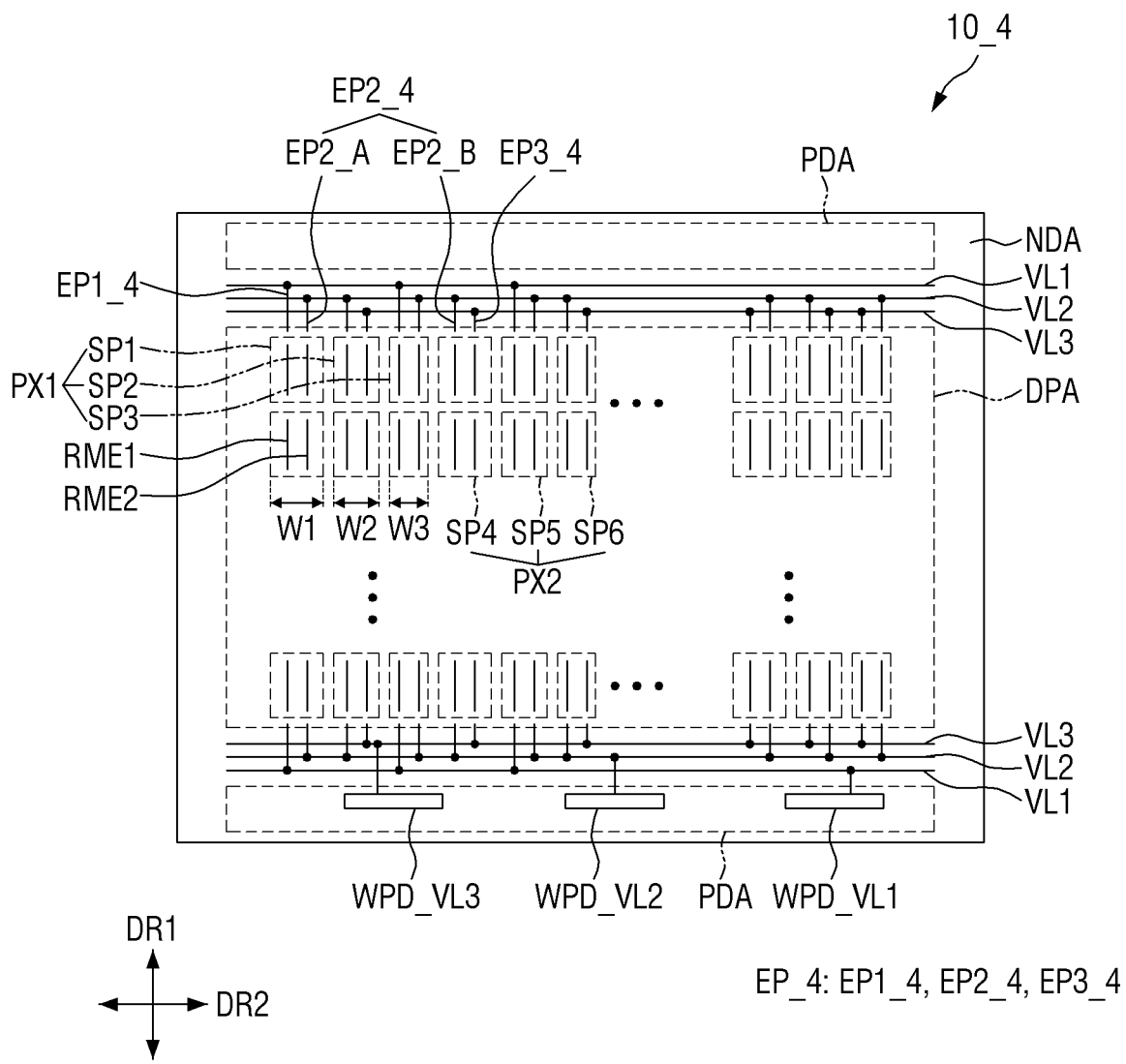
FIG. 24 is a schematic view showing arrangement of lines of a display device and electrodes disposed in sub-pixels according to another embodiment of the disclosure.

FIG. 24 is a schematic view showing arrangement of lines of a display device and electrodes disposed in sub-pixels according to another embodiment of the disclosure.

Referring to FIG. 24, in a display device 10_4 according to an embodiment, each pixel PX may include sub-pixels SPn having different areas, and the sub-pixels SPn belonging to the same pixel PX may include electrodes RME in line with different conductive patterns EP_4. For example, the first sub-pixel SP1 and the third sub-pixel SP3 of the first pixel PX1 may include electrodes RME in line with first conductive patterns EP1_4, while the second sub-pixel SP2 may include an electrode RME in line with a third conductive pattern EP3_4. Similarly, the fourth sub-pixel SP4 and the sixth sub-pixel SP6 of the second pixel PX2 may include electrodes RME in line with third conductive patterns EP3_4, while the fifth sub-pixel SP5 may include an electrode RME in line with the first conductive pattern EP1_4. This embodiment may be different from the embodiment of FIG. 20 in that the sub-pixels SPn belonging to the same pixel PX have different electrode structures and different arrangement structure with the conductive pattern EP_4.

As described above, in the sub-pixels SPn disposed in the display area DPA, the areas of the sub-pixels SPn including electrodes parallel to different conductive patterns EP 4 may be the same. That is to say, for all of the sub-pixels SPn, the arrangement may be modified in a variety of ways as long as the area of the sub-pixels SPn including the electrodes RME in line with the first conductive pattern EP1_4 may be equal to the area of the sub-pixels SPn including the electrodes RME in line with the third conductive pattern EP3_4.

Since the display device 10_4 may include the fifth sub-pixel SP5 having the same structure and area as the second sub-pixel SP2, the sub-pixels SPn belonging to the same pixel PX may have different electrodes RME and arrangement structure with the conductive pattern EP_4. According to this embodiment, the electrode line from which the first conductive pattern EP1_4 may be derived, the electrode line from which the second conductive pattern EP2_4 may be derived, and the electrode line from which the third conductive pattern EP3_4 may be derived may be arranged sequentially and repeatedly, providing more design freedom for the electrode lines RM1, RM2 and RM3.

In concluding the detailed description, those skilled in the art will appreciate that many variations and modifications can be made to the embodiments without substantially departing from the principles of the disclosure. Therefore, the embodiments of the disclosure are used in a generic and descriptive sense only and not for purposes of limitation.

What is claimed is:

1. A display device comprising:
a display area and a non-display area adjacent to the display area;
sub-pixels disposed in the display area in a second direction, each of the sub-pixels including:
a first electrode and a second electrode extended in a first direction intersecting the second direction; and
light-emitting elements disposed on the first electrode and the second electrode;
sub-lines disposed in the non-display area and extended in the second direction; and
conductive patterns extended in the first direction, each of the conductive patterns being connected to at least one of the sub-lines, wherein
the sub-lines comprise a first sub-line, a second sub-line and a third sub-line sequentially disposed from the first sub-line toward the display area,
the conductive patterns are disposed in at least one of the sub-pixels that is closest to the sub-lines, and
the conductive patterns comprise a first conductive pattern connected to the first sub-line, second conductive patterns connected to the second sub-line, and a third conductive pattern connected to the third sub-line.

2. The display device of claim 1, wherein the first electrode and the second electrode of each of the sub-pixels are disposed in line in the first direction with different conductive patterns.

3. The display device of claim 2, wherein
each of the sub-pixels comprises an emission area in which the light-emitting elements are disposed, and a subsidiary area spaced apart from the emission area in the first direction, and
the first electrode and the second electrode are spaced apart from the conductive patterns in the first direction in the subsidiary area of at least some of the sub-pixels.

4. The display device of claim 2, wherein the sub-pixels comprise:
a first sub-pixel having the first electrode in line with the first conductive pattern in the first direction; and
a second sub-pixel having the second electrode in line with the third conductive pattern in the first direction.

5. The display device of claim 4, wherein the second conductive patterns comprise:
a first-type conductive pattern in line with the second electrode of the first sub-pixel in the first direction; and
a second-type conductive pattern in line with the first electrode of the second sub-pixel in the first direction.

6. The display device of claim 5, wherein
the first conductive pattern and the third conductive pattern are spaced apart from each other in the second direction, and
the first-type conductive pattern and the second-type conductive pattern adjacent to each other are disposed between the first conductive pattern and the third conductive pattern.

7. The display device of claim 4, wherein a direction in which a first end of each of the light-emitting elements disposed in the first sub-pixel faces is same as a direction in which a first end of each of the light-emitting elements disposed in the second sub-pixel faces.

8. The display device of claim 4, wherein
an area of the first sub-pixel and an area of the second sub-pixel are same, and
the sub-pixels further comprise a third sub-pixel having an area smaller than the area of the first sub-pixel and including a first electrode in line with the first conductive pattern in the first direction.

9. The display device of claim 8, wherein light emitted from the light-emitting elements disposed in the first sub-pixel and light emitted from the light-emitting elements disposed in the third sub-pixel have different colors.

10. The display device of claim 2, wherein the sub-pixels comprise:
a first sub-pixel having the first electrode in line with the first conductive pattern in the first direction; and
a second sub-pixel having the second electrode in line with the third conductive pattern in the first direction.

11. The display device of claim 10, wherein the second conductive patterns comprise:
a first-type conductive pattern in line with the second electrode of the first sub-pixel in the first direction; and
a second-type conductive pattern in line with the second electrode of the second sub-pixel in the first direction.

12. The display device of claim 11, wherein
the first conductive pattern and the third conductive pattern are spaced apart from each other in the second direction,
the first-type conductive pattern is disposed between the first conductive pattern and the third conductive pattern, and
the second-type conductive pattern is spaced apart from the first-type conductive pattern in the second direction with the third conductive pattern therebetween.

13. The display device of claim 10, wherein a direction in which a first end of each of the light-emitting elements disposed in the first sub-pixel faces is different from a direction in which a first end of each of the light-emitting elements disposed in the second sub-pixel faces.

14. The display device of claim 10, wherein
an area of the first sub-pixel and an area of the second sub-pixel are same, and
the sub-pixels further comprise a third sub-pixel having an area smaller than the area of the first sub-pixel and including a first electrode in line with the first conductive pattern in the first direction.

15. The display device of claim 1, wherein
a length of the first conductive pattern in the first direction is larger than a length of the second conductive pattern in the first direction, and
a length of the second conductive pattern in the first direction is larger than a length of the third conductive pattern in the first direction.

16. The display device of claim 15, wherein
the conductive patterns and the first electrode and the second electrode are disposed on a same layer, and
the sub-lines and the conductive patterns are disposed on different layers.

17. A method of fabricating a display device, the method comprising:
preparing sub-lines extended in a first direction, and electrode lines each connected to one of the sub-lines and extended in a second direction intersecting the first direction;
ejecting light-emitting elements onto the electrode lines;
applying a first alignment voltage to a first electrode line among the electrode lines;
grounding second electrode lines spaced apart from the first electrode line in the first direction, and
applying a second alignment voltage having a polarity opposite to a polarity of the first alignment voltage to a third electrode line spaced apart from one of the second electrode lines in the first direction, to align the light-emitting elements on the first electrode and one of the second electrode lines or on another one of the second electrode lines and the third electrode line; and
separating the electrode lines into parts to form electrodes on which the light-emitting elements are arranged and conductive patterns each connected to a sub-line.

18. The method of claim 17, wherein
the preparing of the sub-lines comprise:
preparing a first sub-line to which the first electrode line is connected;
preparing a second sub-line to which the second electrode lines are connected; and
preparing a third sub-line to which the third electrode line is connected, and the forming of the conductive patterns comprises:
forming a first conductive pattern by separating the first electrode line to be connected to the first sub-line;
forming second conductive patterns by separating the second electrode lines to be connected to the second sub-line; and
forming a third conductive pattern by separating the third electrode line to be connected to the third sub-line.

19. The method of claim 18, wherein
the second electrode lines are disposed between the first electrode line and the third electrode line, and
the forming of the second conductive patterns comprises:
forming a first-type conductive pattern from which one of the second electrode lines that is adjacent to the first electrode line is separated; and
forming a second-type conductive pattern from which the other one of the second electrode lines that is adjacent to the third electrode line is separated.

20. The method of claim 19, wherein
the forming of the electrodes comprises forming a first electrode and a second electrode that are each in line with a respective one of the conductive patterns in a second direction, and
a part of the light-emitting elements are disposed on the first electrode in line with the first conductive pattern and the second electrode in line with the first-type conductive pattern, and
another part of the light-emitting elements are disposed on the first electrode in line with the second-type conductive pattern and the second electrode in line with the third conductive pattern.

* * * * *